(12) United States Patent  (10) Patent No.: US 8,327,243 B1
Norrie  (45) Date of Patent: Dec. 4, 2012

(54) SYSTEM AND METHOD FOR GENERATING LOCATOR POLYNOMIALS

(75) Inventor: Christopher I. W. Norrie, San Jose, CA (US)

(73) Assignee: Integrated Device Technology Inc., San Jose, CA (US)

(*) Notice: Subject to any disclaimer, the term of this patent is extended or adjusted under 35 U.S.C. 154(b) by 273 days.

(21) Appl. No.: 12/857,391

(22) Filed: Aug. 16, 2010

(51) Int. Cl.
*H03M 13/00* (2006.01)

(52) U.S. Cl. ........................................ 714/785; 714/758

(58) Field of Classification Search .................. 714/758, 714/785
See application file for complete search history.

(56) References Cited

U.S. PATENT DOCUMENTS

| | | | |
|---|---|---|---|
| 5,010,554 A * | 4/1991 | Bechtel et al. | 714/759 |
| 2002/0199153 A1* | 12/2002 | Fall | 714/781 |
| 2010/0235718 A1* | 9/2010 | Yang et al. | 714/780 |

* cited by examiner

*Primary Examiner* — M. Mujtaba K Chaudry
(74) *Attorney, Agent, or Firm* — Kenneth Glass; Stanley J. Pawlik; Glass & Associates

(57) ABSTRACT

A syndrome generator generates odd syndromes of a sequence of syndromes and stores the odd syndromes in registers. A syndrome sequencer identifies the register storing the next syndrome of the sequence of syndromes, reads the syndrome from the register, and outputs the syndrome to a sequential polynomial generator. Further, the syndrome sequencer generates an even syndrome by squaring the syndrome read from the register and writes the even syndrome into the same register. Moreover, the syndrome sequencer outputs each syndrome of the sequence of syndromes in sequential order. The sequential polynomial generator generates a locator polynomial in a number of iterations based on the sequence of syndromes received from the syndrome sequencer.

24 Claims, 12 Drawing Sheets

|   1    |   3    |   5    |   7    | ← 600
|--------|--------|--------|--------|
| 145a   | 145b   | 145c   | 145d   |
| S1     | S3     | S5     | S7     |

|   1    |   3    |   5    |   7    | ← 600
|--------|--------|--------|--------|
| 145a   | 145b   | 145c   | 145d   |
| S2     | S3     | S5     | S7     |

|   1    |   3    |   5    |   7    | ← 600
|--------|--------|--------|--------|
| 145a   | 145b   | 145c   | 145d   |
| S4     | S6     | S5     | S7     |

|   1    |   3    |   5    |   7    | ← 600
|--------|--------|--------|--------|
| 145a   | 145b   | 145c   | 145d   |
| S8     | S6     | S10    | S7     |

SYSTEM AND METHOD FOR GENERATING LOCATOR POLYNOMIALS

BACKGROUND

Bose-Chaudhuri-Hochquenghem (BCH) codes are a generalized from of Hamming code often employed in error detection and correction circuits. In these error detection and correction circuits, an error correction code is generated for a datum based on a BCH code. The datum and the error correction code are then stored together as a data unit. For example, the data unit may be stored in a memory location of a memory device. A check is then performed for data bit errors in the data unit, for example when reading the data unit from the memory location of the memory device. In this error checking process, syndromes are generated based on the data unit and a locator polynomial is generated based on the syndromes.

The locator polynomial indicates a location of a data bit error, if any, in the data unit. Moreover, the locator polynomial may indicate a number of data bit errors in the data unit depending upon the error correction code. Generally, the number of data bit errors that the error detection and correction circuit may detect in the data unit increases with the number of data bits in the error correction code as well as the number of syndromes in the sequence of syndromes. In addition to detecting data bit errors in the data unit, the error detection and correction circuit corrects up to a number of data bit errors detected in the data unit, for example by logically negating each data bit detected as a data bit error. Typically, the error detection and correction circuit corrects each data bit detected as a data bit error in the data unit.

One type of error detection and correction circuit employing BCH codes includes an odd syndrome generation circuit and an even syndrome generation circuit. The odd syndrome generation circuit generates odd syndromes of a sequence of syndromes by performing logical operations on the data bits of the data unit. Typically, the odd syndrome generator circuit includes an exclusive OR tree implemented in logic circuits for generating the odd syndromes. Moreover, the odd syndrome generation circuit writes the odd syndromes into registers dedicated to the odd syndromes.

The even syndrome generation circuit generates the even syndromes of the sequence of syndromes and writes the even syndromes into registers dedicated to the even syndromes. Because the odd syndromes are stored in registers dedicated to the odd syndromes and because the even syndromes are stored in registers dedicated to the even syndromes, the number of registers for storing syndromes in the error detection and correction circuit is equal to the number of syndromes in the sequence of syndromes.

In some applications, it is desirable to have an error detection and correction circuit for detecting and correcting a large number of data bits relative to the number of data bits of a data unit. In these applications, the sequence of syndromes includes a large number of syndromes relative to the number of data bits in the data unit. Moreover, the registers for storing the syndromes consume a considerable amount of power and area in an integrated circuit implementation of the error detection and correction circuit.

SUMMARY

In various embodiments, a system includes a locator polynomial generator for generating a sequence of syndromes. The locator polynomial generator includes a syndrome generator for generating odd syndromes of the sequence of syndromes and registers for storing the odd syndromes. Additionally, the locator polynomial generator includes a syndrome sequencer for generating even syndromes of the sequence of syndromes. The locator polynomial identifies the register storing the next syndrome in the sequence of syndromes, reads the syndrome from the register, and outputs the syndrome. Further, the syndrome sequencer generates an even syndrome by squaring the syndrome read from the register and replaces the syndrome read from the register with the even syndrome by writing the squared syndrome into the register. In this way, the syndrome sequencer generates the even syndromes of the sequence of syndromes, and outputs both the even syndromes and the odd syndromes of the sequence of syndromes in sequential order.

The locator polynomial generator also includes a sequential polynomial generator for generating a locator polynomial in a sequence of iterations based on the sequence of syndromes output from the syndrome sequencer. In this process, the sequential polynomial generator generates an initial polynomial based on an initial syndrome of the sequence of syndromes and generates subsequent polynomials based on subsequent syndromes of the sequence of syndromes and preceding polynomials generated by the sequential polynomial generator. The polynomial generated by the sequential polynomial generator in the last iteration of the sequence of iterations is the locator polynomial.

Because the syndrome sequencer generates each even syndrome of the sequence of syndromes based on a preceding syndrome of the sequence of syndromes stored in a register and replaces the preceding syndrome with the even syndrome, the locator polynomial generator need not have more registers for storing the sequence of syndromes than the number of odd syndromes in the sequence of the syndromes. In this way, the locator polynomial generator consumes less power and area than other locator polynomial generators.

In further embodiments, the syndrome sequencer includes a logic circuit for generating a sequence of register identifiers. Each register identifier of the sequence of register identifiers identifies a corresponding register that contains the next syndrome of the sequence of syndromes to be output from the syndrome sequencer. Moreover, the syndrome sequencer reads syndromes from the registers in sequential order based on the sequence of register identifiers. Because the logic circuit generates the sequence of register identifiers, the locator polynomial generator need not include registers for concurrently storing the sequence of register identifiers. In this way, the locator polynomial generator consumes less power and area than other locator polynomial generators.

A system, in accordance with one embodiment, includes a syndrome generator, a series of registers, a syndrome sequencer, and a sequential polynomial generator. The series of registers are coupled to the syndrome generator and the syndrome sequencer. Additionally, the syndrome sequencer is coupled to the sequential polynomial generator. The syndrome generator is configured to generate a series of odd syndromes for a sequence of syndromes including even syndromes and odd syndromes. The series of registers store the odd syndromes. Moreover, the series of registers have a one-to-one correspondence with the odd syndromes of the series of odd syndromes. The syndrome sequencer is configured to generate the sequence of syndromes by selecting each syndrome of the sequence of syndromes in a sequential order of the sequence of syndromes, identifying a register of the series of registers storing the selected syndrome, reading the selected syndrome from the identified register, outputting the selected syndrome for use in generating a locator polynomial, generating an even syndrome of the sequence of syndromes by squaring the selected syndrome, and replacing the selected syndrome stored in the series of registers with the squared syndrome by storing the squared syndrome into the register storing the selected syndrome. The locator polynomial generator is configured to generate the locator polynomial based on the sequence of syndromes generated by the syndrome sequencer.

A system, in accordance with one embodiment, includes a syndrome generator, a series of registers, a syndrome sequencer, and a sequential polynomial generator. The series of registers are coupled to the syndrome generator and the syndrome sequencer. Additionally, the syndrome sequencer is coupled to the sequential polynomial generator. The syndrome generator is configured to generate a series of odd syndromes for a sequence of syndromes including even syndromes and odd syndromes. The series of registers store the odd syndromes. Moreover, the series of registers have a one-to-one correspondence with the odd syndromes of the series of odd syndromes. The syndrome sequencer is configured to generate a sequence of register identifiers having a one-to-one correspondence with the sequence of syndromes. Although each register identifier of the sequence of register identifiers identifies a register of the series of registers for storing the corresponding syndrome of the sequence of syndromes, the number of registers in the series of register is less than the number of register identifiers in the sequence of register identifiers. The syndrome sequencer is further configured to generate the sequence of syndromes by selecting syndromes of the sequence of syndromes, identifying for each selected syndrome a register of the series of registers storing the selected syndrome based on the sequence of register identifiers, reading the selected syndrome from the identified register, outputting the selected syndrome for use in generating a locator polynomial, generating each even syndrome of the sequence of syndromes by squaring a corresponding syndrome of the selected syndromes, and replacing the corresponding syndrome stored in the series of registers with the squared syndrome by storing the squared syndrome into the register storing the corresponding syndrome. The locator polynomial generator is configured to generate the locator polynomial based on the sequence of syndromes generated by the syndrome sequencer.

A method, in accordance with one embodiment, includes generating a series of odd syndromes for a sequence of syndromes including even syndromes and odd syndromes, and storing the series of odd syndromes into a series of registers. The registers of the series of registers have a one-to-one correspondence with the odd syndromes of the series of odd syndromes. The method further includes generating the sequence of syndromes by selecting syndromes of the sequence of syndromes, identifying for each selected syndrome a register of the series of registers storing the selected syndrome, reading the selected syndrome from the identified register, outputting the selected syndrome for use in generating a locator polynomial, generating each even syndrome of the sequence of syndromes by squaring a corresponding syndrome of the selected syndromes, and replacing the corresponding syndrome stored in the series of registers with the squared syndrome by storing the squared syndrome into the register storing the corresponding syndrome. Additionally, the method includes generating the locator polynomial based on the sequence of syndromes.

Because the method generates each even syndrome based on a syndrome of the sequence of syndromes stored in a register of the series of registers and replaces that syndrome with the even syndrome, the method need not use more registers for storing the sequence of syndromes than the number of odd syndromes in the sequence of the syndromes. In this way, an integrated circuit implementing the method consumes less power and area than other locator polynomial generators.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIGS. 10A-10D are block diagrams of a syndrome storage, in accordance with an embodiment of the present invention.

DETAILED DESCRIPTION

In various embodiments, a syndrome generator generates odd syndromes of a sequence of syndromes and writes the odd syndromes in registers. A syndrome sequencer identifies the register storing the next syndrome of the sequence of syndromes, reads the syndrome from the register, and outputs the syndrome to a sequential polynomial generator. Further, the syndrome sequencer generates an even syndrome by squaring the syndrome read from the register and writes the even syndrome into the same register. Moreover, the syndrome sequencer outputs each syndrome of the sequence of syndromes in sequential order. The sequential polynomial generator generates a locator polynomial in a sequence of iterations based on the sequence of syndromes received from the syndrome sequencer.

Because the syndrome sequencer generates each even syndrome of the sequence of syndromes based on a preceding syndrome of the sequence of syndromes stored in a register and replaces the preceding syndrome with the even syndrome, the locator polynomial generator need not have more registers for storing the sequence of syndromes than the number of odd syndromes in the sequence of the syndromes. In this way, the locator polynomial generator consumes less power and area than other locator polynomial generators.

In further embodiments, the syndrome sequencer includes a logic circuit for generating a sequence of register identifiers for identifying registers in the locator polynomial generator. Because the logic circuit generates the sequence of register identifiers, the locator polynomial generator need not include registers for concurrently storing the sequence of register identifiers. In this way, the locator polynomial generator consumes less power and area than other locator polynomial generators.

Figure 1:
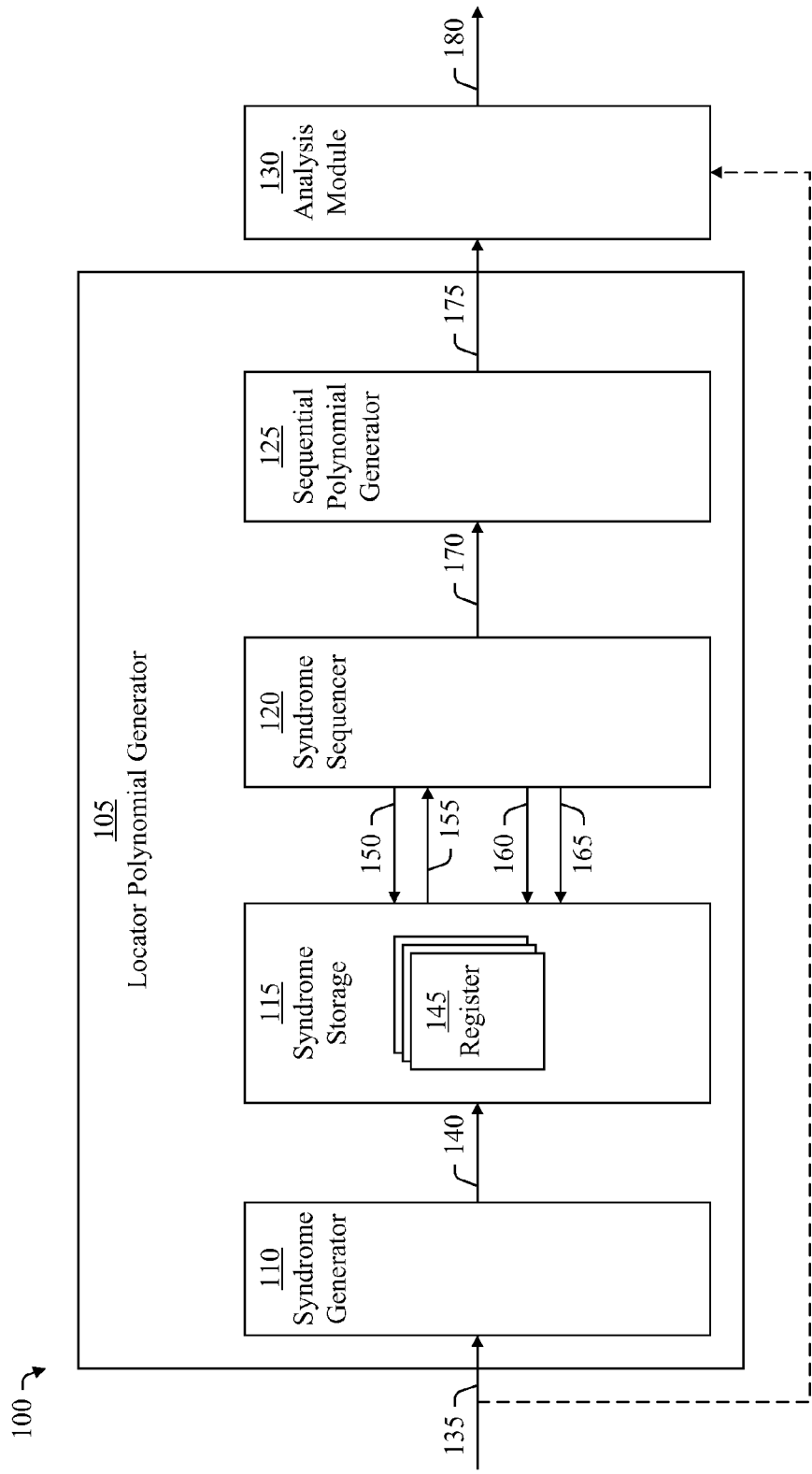
FIG. 1 is a block diagram of a system, in accordance with an embodiment of the present invention.

FIG. 1 illustrates a system 100, in accordance with an embodiment of the present invention. The system 100 includes a locator polynomial generator 105 and an analysis module 130 coupled (e.g., connected) to the locator polynomial generator 105. The locator polynomial generator 105 receives an input data unit 135 including a datum and an error correction code, generates a locator polynomial 175 based on the input data unit 135, and outputs the locator polynomial 175 to the analysis module 130. The analysis module 130 identifies up to a predetermined number of data bit errors in the input data unit 135 based on the locator polynomial 175 and generates an output data unit 180 indicating the bit position (i.e., location) of each data bit error identified in the input data unit 135. In a further embodiment, the analysis module 130 receives the input data unit 135 and generates an output data unit 180 by correcting up to a predetermined number of the data bit errors identified in the input data unit 135. For example, the analysis module 130 may logically negate each data bit identified as a data bit error in the input data unit 135.

The locator polynomial generator 105 includes a syndrome generator 110, a syndrome storage 115, a syndrome sequencer 120, and a sequential polynomial generator 125. The syndrome storage 115 is coupled (e.g., connected) to the syndrome generator 110 and the syndrome sequencer 120. The sequential polynomial generator 125 is coupled (e.g., connected) to the syndrome sequencer 120 and the analysis module 130. The syndrome generator 110 generates odd syndromes 140 for a sequence of syndromes including both odd syndromes and even syndromes. Further, the syndrome generator 110 writes the odd syndromes 140 into the syndrome storage 115.

In various embodiments, the syndrome generator 110 generates the odd syndromes 140 in an iterative process in which the syndrome generator 110 generates intermediate results for the odd syndromes 140, writes the intermediate results in the syndrome storage 115, reads the intermediate results from the syndrome storage 115, and writes (i.e., stores) the odd syndromes 140 into the syndrome storage 115. In this way, the syndrome generator 110 overwrites the intermediate results stored in the syndrome storage 115 with the odd syndromes 140. In further embodiments, the syndrome generator 110 writes the odd syndromes 140 into the syndrome storage 115 substantially simultaneously (e.g., in a same iteration or a same clock cycle). In this way, the syndrome generator 110 concurrently writes the odd syndromes 140 into the syndrome storage 115. In various embodiments, the syndrome generator 110 does not store the odd syndromes 140 in an internal storage within the syndrome generator 110. In this way, size and power consumption of the locator polynomial generator 105 is minimized (e.g., reduced).

The syndrome storage 115 includes registers 145 for storing syndromes. The syndrome sequencer 120 generates a register identifier 150 and reads a syndrome 155 stored in a register 145 of the syndrome storage 115 based on the register identifier 150. Further, the syndrome sequencer 120 outputs a sequence of syndromes 170, which includes the syndrome 155 read from the register 145, to sequential polynomial generator 125 for use in generating the locator polynomial 175, as is described more fully herein. Additionally, the syndrome sequencer 120 generates an even syndrome 165 of the sequence of syndromes 170 based on the syndrome 155 read from the syndrome storage 115, and generates a register identifier 160 by copying the register identifier 150. The syndrome sequencer 120 replaces the syndrome 155 stored in the syndrome storage 115 with the even syndrome 165 by writing the even syndrome 165 into the register 145 of the syndrome storage 115 identified by register identifier 160. In this way, the syndrome sequencer 120 generates each of the even syndromes of the sequence of syndromes 170, and writes (i.e., stores) the even syndromes of the sequence of syndromes 170 into the syndrome storage 115.

In various embodiments, the locator polynomial generator 105 generates the locator polynomial 175 based on a Bose-Chaudhuri-Hochquenghem (BCH) code. One property of a BCH code is that an even syndrome in a sequence of syndromes (e.g., a sequence of syndromes 170) may be generated by squaring a previous syndrome in the sequence of syndromes. In these embodiments, the syndrome sequencer 120 reads a syndrome 155 from a register 145 in the syndrome storage 115 and outputs the syndrome 155 read from the syndrome storage 115 to the locator polynomial generator 105 as part of the sequence of syndromes 170 generated by the syndrome sequencer 120. Additionally, the syndrome sequencer 120 generates an even syndrome 165 by squaring the syndrome 155 read from the syndrome storage 115 and replaces the syndrome 155 with the even syndrome 165 in the syndrome storage 115.

In various embodiments, the syndrome sequencer 120 reads syndromes 155 (i.e., even syndromes and odd syndromes) from the syndrome storage 115 in a sequential order. Further, the syndrome sequencer 120 outputs the syndromes 155 read from the syndrome storage 115 to the sequential polynomial generator 125 in the same sequential order. In this way, the syndrome sequencer 120 outputs the sequence of syndromes 170 to the sequential polynomial generator 125 in a sequential order of the sequence of syndromes 170. Moreover, the syndrome sequencer 120 replaces a syndrome 155 read from the syndrome storage 115 with an even syndrome 165 succeeding the syndrome 155 in the sequence of syndromes 170, subsequently reads the even syndrome 165 from the syndrome storage 115 as a syndrome 155, and outputs the syndrome 155 (i.e., the even syndrome 165) to the sequential polynomial generator 125 as part of the sequence of syndromes 170. In this way, the syndrome storage 115 need not concurrently store a number of syndromes greater than the number of odd syndromes 140 initially stored in the syndrome storage 115.

Because the syndrome storage 115 need not store a number of syndromes greater than the number of odd syndromes 140 initially stored in the syndrome storage 115, size of the syndrome storage 115 (e.g., area of an integrated circuit) is reduced in comparison to other locator polynomial generators 105 that concurrently store an entire sequence of syndromes. Additionally, power consumption of the syndrome storage 115 is reduced in comparison to other locator polynomial generators 105 that concurrently store an entire sequence of syndromes.

The sequential polynomial generator 125 receives the syndromes of the sequence of syndromes 170 in the sequential order of the sequence of syndromes 170. In some embodiments, the sequential polynomial generator 125 receives the syndromes of the sequence of syndromes 170 in the sequential order of the sequence of syndromes 170 by receiving each syndrome of the sequence of syndromes 170 individually. In other embodiments, the sequential polynomial generator 125 receives the syndromes of the sequence of syndromes 170 in the sequential order of the sequence of syndromes 170 by receiving some of the syndromes of the sequence of syndromes 170 individually and receiving other syndromes of the sequence of syndromes 170 as a pair of successive syndromes in the sequence of syndromes 170.

In various embodiments, the sequential polynomial generator 125 generates a sequence of polynomials based on the sequence of syndromes 170 received from the syndrome sequencer 120. The last polynomial of the sequence of polynomials is the locator polynomial 175. Moreover, the sequential polynomial generator 125 generates the locator polynomial 175 by outputting the last polynomial in the sequence of polynomials. In various embodiments, the sequential polynomial generator 125 generates the sequence of polynomials in a sequence of iterations.

In one embodiment, the iterations of the sequence of iterations have a one-to-one correspondence with the polynomials of the sequence of polynomials. In this embodiment, the sequential polynomial generator 125 receives a first syndrome of the sequence of syndromes 170 in a first iteration of the sequence of iterations. The sequential polynomial generator 125 generates a first polynomial of the sequence of polynomials based on the first syndrome of the sequence of syndromes 170. In the next iteration (i.e., succeeding iteration), the sequential polynomial generator 125 receives the next syndrome of the sequence of syndromes 170 and generates the next polynomial in the sequence of polynomials based on the polynomial generated in the previous iteration (i.e., the preceding iteration) and the syndrome received in the current iteration (i.e., succeeding iteration). The sequential polynomial generator 125 generates the subsequent polynomials of the sequence of polynomials in the subsequent iterations of the sequence of iterations by repeating this process. Moreover, the polynomial generated in a last iteration of the sequence of iterations is the locator polynomial 175.

In various embodiments, the syndrome storage 115 is implemented in an integrated circuit of an integrated circuit device which may include an integrated circuit package containing the integrated circuit. In some embodiments, the system 100 is implemented in an integrated circuit of an integrated circuit device which may include an integrated circuit package containing the integrated circuit. In some embodiments, the system 100 is implemented in more than one integrated circuit of an integrated circuit device which may include a multichip package containing the integrated circuits.

In some embodiments, the locator polynomial generator 105 is implemented in an integrated circuit of an integrated circuit device which may include an integrated circuit package containing the integrated circuit. In some embodiments, the locator polynomial generator 105 is implemented in more than one integrated circuit of an integrated circuit device which may include a multichip package containing the integrated circuits.

Figure 2:
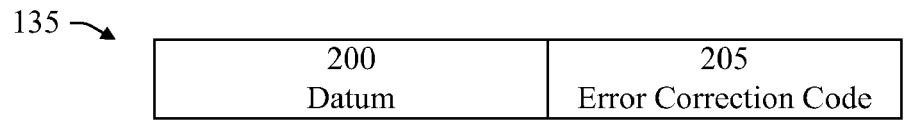
FIG. 2 is a block diagram of an input data unit, in accordance with an embodiment of the present invention.

FIG. 2 illustrates the input data unit 135, in accordance with an embodiment of the present invention. The input data unit 135 includes a datum 200 and an error correction code 205 corresponding to the datum 200. The error correction code 205 is generated for detecting data bit errors in input data unit 135. In various embodiments, the error correction code 205 is generated based on based on a Bose-Chaudhuri-Hochquenghem (BCH) code for detecting up to a predetermined number of data bit errors in the input data unit 135.

Figure 3:
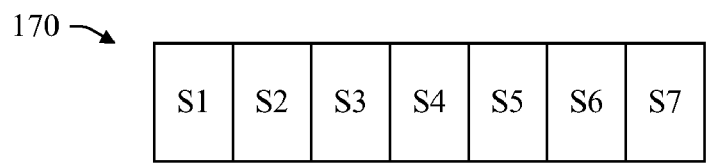
FIG. 3 is a block diagram of a sequence of syndromes, in accordance with an embodiment of the present invention.

FIG. 3 illustrates the sequence of syndromes 170, in accordance with an embodiment of the present invention. The sequence of syndromes 170 includes seven syndromes S1-S7. In other embodiments, the sequence of syndromes 170 may include more or fewer than seven syndromes S1-S7. For example, the sequence of syndromes 170 may include forty syndromes for detecting and correcting up to forty bit errors in a sixty-four bit data unit.

The sequence of syndromes 170 has a sequential order as indicated by the reference numerals identifying the syndromes S1-S7. Moreover, the sequential order is a sequence of integers from 1 to 7 in the reference numerals. The syndromes S1, S3, S5, and S7, which are identified by a series of odd integers in the sequence of integers, are a series of odd syndromes generated by the syndrome generator 110. Moreover, the series of odd syndromes are in sequential order according to the numerical order of the series of odd integers. In this way, the series of odd syndromes form an ordered series of odd syndromes in the sequence of syndromes 170. The syndromes S2, S4, and S6, which are identified by a series of even integers in the sequence of integers, are a series of even syndromes generated by the syndrome sequencer 120. Moreover, the series of even syndromes are in sequential order according to the numerical order of the series of even integers. In this way, the series of even syndromes form an ordered series of even syndromes in the sequence of syndromes 170.

Figure 4:
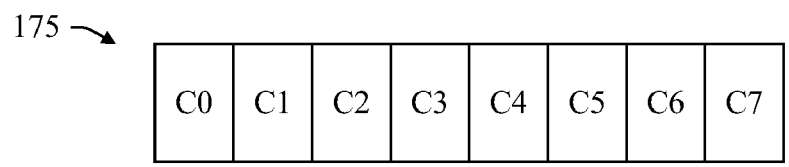
FIG. 4 is a block diagram of a locator polynomial, in accordance with an embodiment of the present invention.

FIG. 4 illustrates the locator polynomial 175, in accordance with an embodiment of the present invention. The locator polynomial 175 includes coefficients C0-C7. In this way, the locator polynomial 175 represents a polynomial function having the coefficients C0-C7. For example, the polynomial function F(x) may be expressed by the following equation.

$$F(x)=C0+C1*x+C2*x^2+C3*x^3+C4*x^3+C5*x^5+C6*x^6+C7*x^7 \quad \text{(Eq. 1)}$$

In various embodiments, the sequential polynomial generator 125 generates the locator polynomial 175 by performing a Berlekamp-Massey algorithm.

In various embodiments, the analysis module 130 identifies data bit errors in the input data unit 135 based on the locator polynomial 175 generated by the sequential polynomial generator 125. In some embodiments, the analysis module 130 performs a Chien search algorithm to identify roots of the polynomial function represented by the coefficients C0-C7 of the locator polynomial 175. In this process, the analysis module 130 determines a primitive element $\alpha$ such that the polynomial function F(x) may be expressed by the following equation in which the element i is the bit position (i.e., location) of a data bit in the input data unit 135, exponential powers of $\alpha$ are roots of the polynomial function F(x), and t is the number of data bit errors that may be detected and corrected in the input data unit 135 based on the locator polynomial 175.

$$F(x)=\Lambda(\alpha^i)=\Sigma_{j=0}^{t}\lambda\alpha^{ij} \quad \text{(Eq. 2)}$$

The roots of the polynomial function F(x) are then used to locate data bit errors in the input data unit 135, where the exponential powers of the primitive element $\alpha$ yield the bit positions of data bit errors occurring in the input data unit 135. Although the locator polynomial 175 includes eight coefficients C0-C7 in the exemplary embodiment of FIG. 4, the locator polynomial 175 may have more or fewer than eight coefficients in other embodiments.

Figure 5:
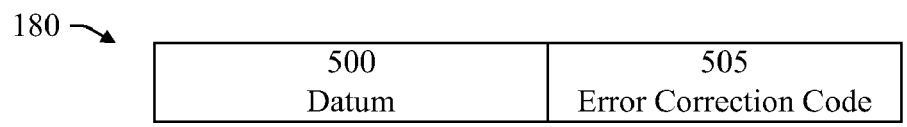
FIG. 5 is a block diagram of an output data unit, in accordance with an embodiment of the present invention.

FIG. 5 illustrates the output data unit 180, in accordance with an embodiment of the present invention. The output data unit 180 includes a datum 500 and an error correction code 505 corresponding to the datum 500. If the analysis module 130 detects a data bit error in the datum 200 of the input data unit 135, the analysis module 130 generates the datum 500 of the output data unit 180 by correcting the data bit error detected in the datum 200 of the input data unit 135. In some embodiments, if the analysis module 130 detects a data bit error in the error correction code 205 of the input data unit 135, the analysis module 130 generates the error correction code 505 of the output data unit 180 by correcting the data bit error detected in the error correction code 205 of the input data unit 135.

In various embodiments, if the analysis module 130 does not detect and correct any data bit error in the datum 200 of the input data unit 135, the datum 500 of the output data unit 180 is the same as the datum 200 of the input data unit 135. Additionally, if the analysis module 130 does not detect and correct any data bit error in error correction code 205 of the input data unit 135, the error correction code 505 of the output data unit 180 is the same as the error correction code 205 of the input data unit 135. In some embodiments, the output data unit 180 includes the datum 500 but does not include the error correction code 505.

FIGS. 6A-6G illustrates the syndrome storage 115, in accordance with an embodiment of the present invention. The registers 145 (e.g., registers 145a-d) of the syndrome storage 115 have a one-to-one correspondence with the odd syndromes in the sequence of syndromes 170. Stated differently, the number of registers 145 in the syndrome storage 115 is the same as the number of odd syndromes in the sequence of syndromes 170. Although four exemplary registers 145 are illustrated in FIGS. 6A-6G, the syndrome storage 115 may have more or fewer than four registers 145 in other embodiments.

As illustrated in FIGS. 6A-6G, the registers 145 are identified by a series of register identifiers 600. The register identifiers 600 are integer values in a series of odd integers (e.g., 1, 3, 5, and 7). The register 145a is identified by the register identifier 600 having a value of one, the register 145b is identified by the register identifier 600 having a value of three, the register 145c is identified by the register identifier 600 having a value of five, and the register 145d is identified by the register identifier 600 having a value of seven. In this way, the registers 145 form a series of registers identified by a corresponding series of odd integers. Moreover, the series of odd integers are in numerical order. In this way, the series of register identifiers 600 form an ordered series of odd integers, and the series of registers 145 forms an ordered series of registers 145.

Figure 6A:
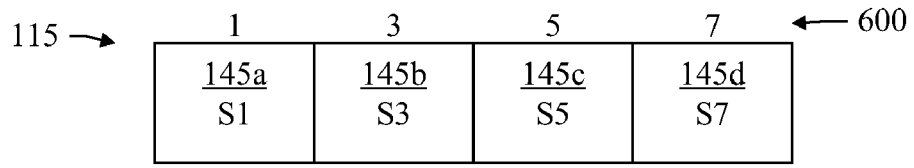
FIGS. 6A-6G are block diagrams of a syndrome storage, in accordance with an embodiment of the present invention.

FIG. 6A illustrates the registers 145 after the syndrome generator 110 has written the odd syndromes 140 into the syndrome storage 115. The odd syndromes 140 include the syndromes S1, S3, S5, and S7 of the sequence of syndromes 170. As illustrated in FIG. 6A, the register 145a contains the syndrome S1, the register 145b contains the syndrome S3, the register 145c contains the syndrome S5, and the register 145d contains the syndrome S7.

FIG. 6A also illustrates the registers 145 after the sequential polynomial generator 125 has completed a first iteration of a sequence of iterations for generating the locator polynomial 175. In the first iteration, the syndrome sequencer 120 reads the syndrome 155 (i.e., S1) stored in the register 145a, outputs the syndrome 155 (i.e., S1) to the sequential polynomial generator 125 as part of the sequence of syndromes 170, and generates the even syndrome 165 (i.e., S2) by squaring the syndrome 155 (i.e., S1) read from the register 145a.

Figure 6B:
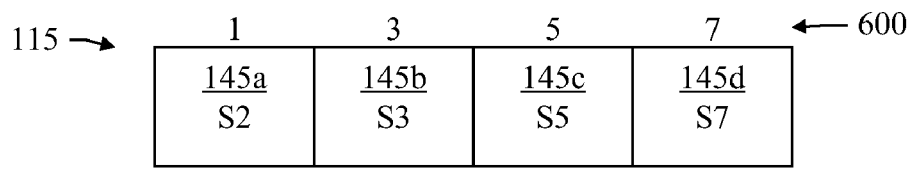

FIG. 6B illustrates the registers 145 after the sequential polynomial generator 125 has completed a second iteration of a sequence of iterations for generating the locator polynomial 175. In the second iteration, the syndrome sequencer 120 replaces the syndrome 155 (i.e., S1) with the even syndrome 165 (i.e., S2) in the register 145a by writing the even syndrome 165 (i.e., S2) into the register 145a, reads the syndrome 155 (i.e., S2) stored in the register 145a, outputs the syndrome 155 (i.e., S2) to the sequential polynomial generator 125 as part of the sequence of syndromes 170, and generates the even syndrome 165 (i.e., S4) by squaring the syndrome 155 (i.e., S2) read from the register 145a.

Figure 6C:
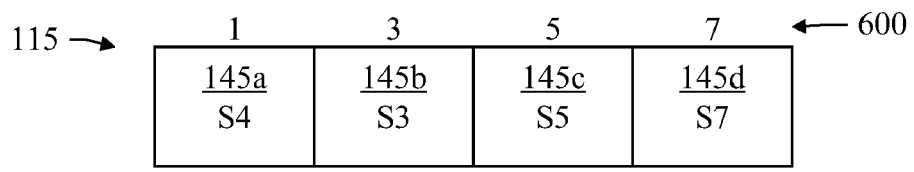

FIG. 6C illustrates the registers 145 after the sequential polynomial generator 125 has completed a third iteration of a sequence of iterations for generating the locator polynomial 175. In the third iteration, the syndrome sequencer 120 replaces the syndrome 155 (i.e., S2) with the even syndrome 165 (i.e., S4) in the register 145a by writing the even syndrome 165 (i.e., S4) into the register 145a, reads the syndrome 155 (i.e., S3) stored in the register 145b, output the syndrome 155 (i.e., S3) to the sequential polynomial generator 125 as part of the sequence of syndromes 170, and generates the even syndrome 165 (i.e., S6) by squaring the syndrome 155 (i.e., S3) read from the register 145b.

Figure 6D:
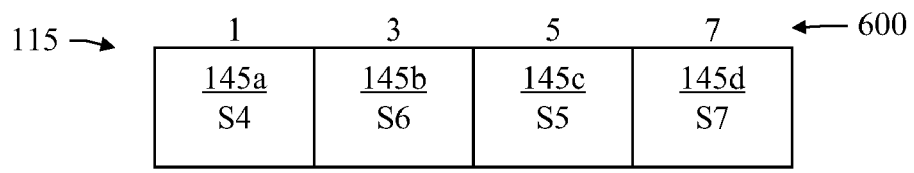

FIG. 6D illustrates the registers 145 after the sequential polynomial generator 125 has completed a fourth iteration of a sequence of iterations for generating the locator polynomial 175. In the fourth iteration, the syndrome sequencer 120 replaces the syndrome 155 (i.e., S3) with the even syndrome 165 (i.e., S6) in the register 145b by writing the even syndrome 165 (i.e., S6) into the register 145b, reads the syndrome 155 (i.e., S4) stored in the register 145a, output the syndrome 155 (i.e., S4) to the sequential polynomial generator 125 as part of the sequence of syndromes 170, and generates the even syndrome 165 (i.e., S8) by squaring the syndrome 155 (i.e., S4) read from the register 145a.

Figure 6E:
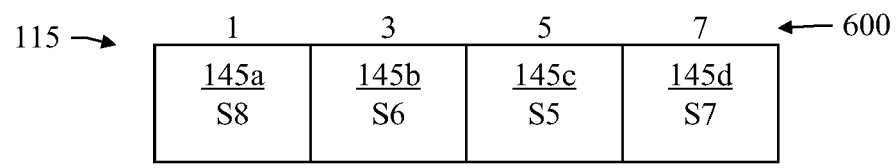

FIG. 6E illustrates the registers 145 after the sequential polynomial generator 125 has completed a fifth iteration of a sequence of iterations for generating the locator polynomial 175. In the fifth iteration, the syndrome sequencer 120 replaces the syndrome 155 (i.e., S4) with the even syndrome 165 (i.e., S8) in the register 145a by writing the even syndrome 165 (i.e., S8) into the register 145a, reads the syndrome 155 (i.e., S5) stored in the register 145c, outputs the syndrome 155 (i.e., S5) to the sequential polynomial generator 125 as part of the sequence of syndromes 170, and generates the even syndrome 165 (i.e., S10) by squaring the syndrome 155 (i.e., S5) read from the register 145c.

Figure 6F:
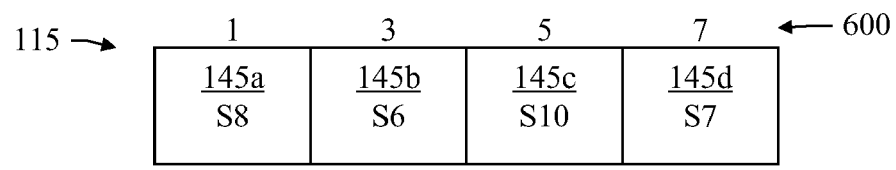

FIG. 6F illustrates the registers 145 after the sequential polynomial generator 125 has completed a sixth iteration of a sequence of iterations for generating the locator polynomial 175. In the sixth iteration, the syndrome sequencer 120 replaces the syndrome 155 (i.e., S5) with the even syndrome 165 (i.e., S10) in the register 145c by writing the even syndrome 165 (i.e., S10) into the register 145c, reads the syndrome 155 (i.e., S6) stored in the register 145b, outputs the syndrome 155 (i.e., S6) to the sequential polynomial generator 125 as part of the sequence of syndromes 170, and generates the even syndrome 165 (i.e., S12) by squaring the syndrome 155 (i.e., S6) read from the register 145a.

Figure 6G:
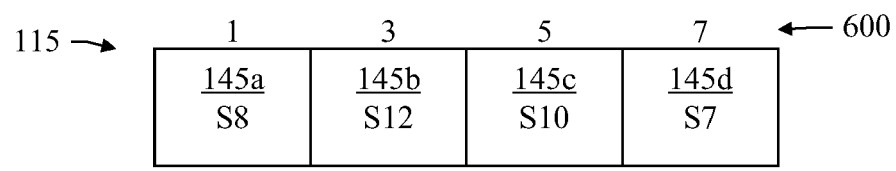

FIG. 6G illustrates the registers 145 after the sequential polynomial generator 125 has completed a seventh iteration of a sequence of iterations for generating the locator polynomial 175. In the seventh iteration, the syndrome sequencer 120 reads the syndrome 155 (i.e., S7) stored in the register 145d, and outputs the syndrome 155 (i.e., S7) to the sequential polynomial generator 125 as part of the sequence of syndromes 170.

In some embodiments, the syndrome sequencer 120 selectively replaces a syndrome 155 read from the syndrome storage 115 with an even syndrome 165. In these embodiments, the syndrome sequencer 120 determines whether a square of the syndrome 155 read from the syndrome storage 115 is to be included in the sequence of syndromes 170 generated by the syndrome sequencer 120. If the syndrome sequencer 120 determines that the square of the syndrome 155 is not to be included in the sequence of syndromes 170 generated by the syndrome sequencer 120, the syndrome sequencer 120 does not replace the syndrome 155 with an even syndrome 165 (i.e., a square of the syndrome 155) in the syndrome storage 115. In further embodiments, the syndrome sequencer 120 does not generate an even syndrome 165 by squaring the syndrome 155 read from the syndrome storage 115 if the syndrome sequencer 120 determines that the square of the syndrome 155 is not to be included in the sequence of syndromes 170 generated by the syndrome sequencer 120.

Figure 7:
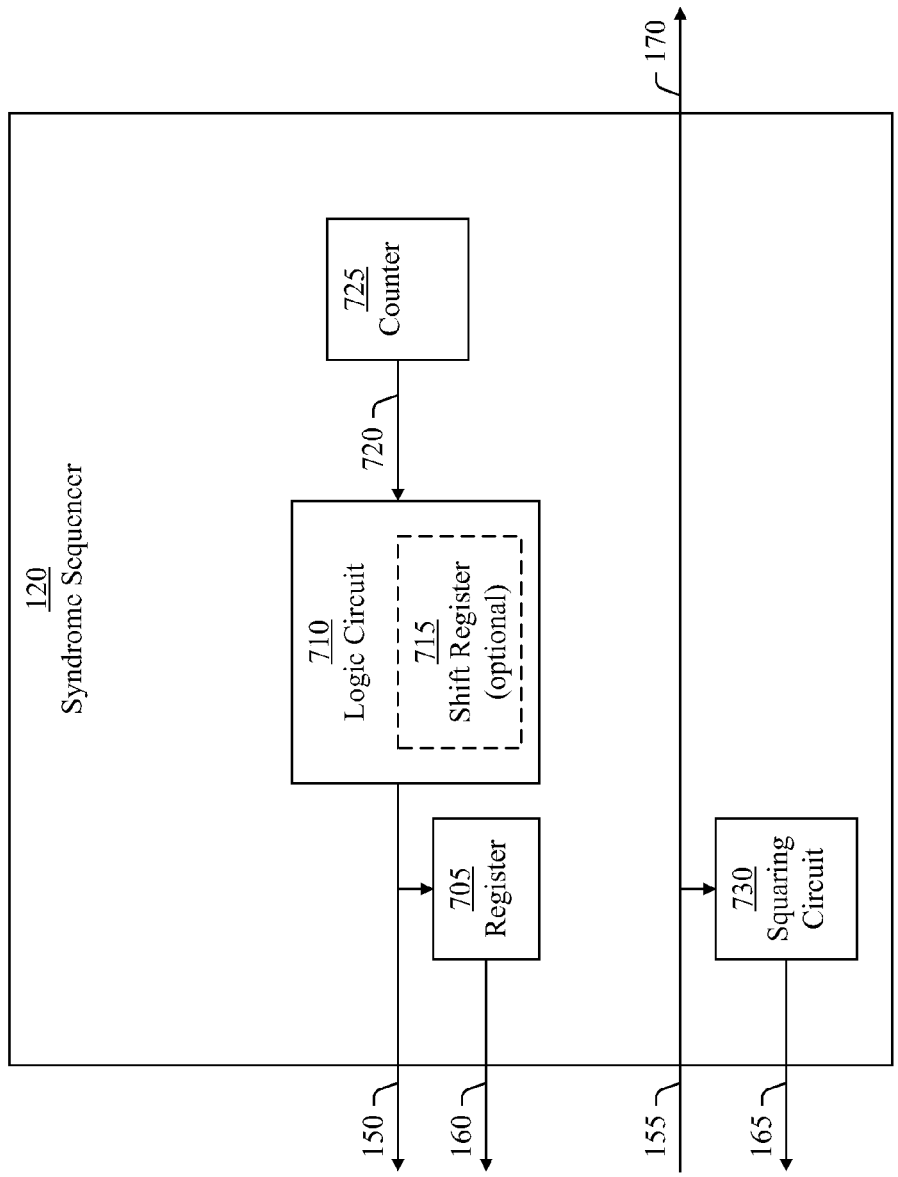
FIG. 7 is a block diagram of a syndrome sequencer, in accordance with an embodiment of the present invention.

FIG. 7 illustrates the syndrome sequencer 120, in accordance with an embodiment of the present invention. The syndrome sequencer 120 includes a register 705, a logic circuit 710, a counter 725, and a squaring circuit 730. The logic circuit 710 is coupled (e.g., connected) to the register 705 and the counter 725. The counter 725 generates integers 720 and outputs the integers 720 to the logic circuit 710. In one embodiment, the counter 725 generates an initial integer 720 having a value of zero upon reset or power-on of the syndrome sequencer 120. In this embodiment, the counter 725 increments the value of the integer 720 until the integer 720 has a final value. In this way, the counter 725 generates a sequence of integers 720.

For example, the counter 725 of the syndrome sequencer 120 may increment the integer 720 by a value of one in successive clock cycles of a clock signal. Further in this example, the final value of the integer 720 is equal to the number of syndromes (e.g., S1-S7) in the sequence of syndromes 170 generated by the syndrome sequencer 120. In this embodiment, the syndrome sequencer 120 resets the counter 725 after the counter 725 has reached the final value of the counter 725. For example, the syndrome sequencer 120 may reset the counter 725 in the next clock cycle of the clock signal after the counter 725 reaches the final value.

The logic circuit 710 receives an integer 720 generated by the counter 725 and generates a register identifier 150 by performing a logic operation on the integer 720. In various embodiments, the logic circuit 710 performs the logic operation on the integer 720 by performing a finite field operation on the integer 720. In this process, the logic circuit 710 determines whether a least significant bit position in the integer 720 has a predetermined value. If the logic circuit 710 determines that the least significant bit position of the integer 720 has the predetermined value, the logic circuit 710 outputs the integer 720 as the register identifier 150. Otherwise, if the logic circuit 710 determines that the least significant bit position of the integer 720 does not have the predetermined value, the logic circuit 710 generates the register identifier 150 by performing a logical right shift operation on the integer 720 to shift a rightmost bit having the predetermined value in the integer 720 to the least significant bit position of the integer 720. In this way, the logic circuit 710 generates a sequence of register identifiers 150 corresponding to the sequence of integers 720 generated by the counter 725.

In some embodiments, the logic circuit 710 is a combinational logic circuit. In other embodiments, the logic circuit 710 is a sequential logic circuit. In various embodiments, the logic circuit 710 includes an optional shift register 715. The shift register 715 identifies a rightmost bit having the predetermined bit value in the integer 720. Further, the shift register 715 performs a logical right shift operation on the integer 720 to shift the rightmost bit having the predetermined value in the integer 720 to the least significant bit position of the integer 720. In some embodiments, the shift register 715 performs the logical right shift operation in a number of clock cycles. For example, the shift register 715 may perform a bit-wise logical right shift operation to shifts bits of the integer 720 to the right by one bit in each of the clock cycles. In some embodiments, the shift register 715 performs the logical shift operation in a single clock cycle. In these embodiments, the shift register 715 determines the number of bit positions in which the rightmost bit having the predetermined value in the integer 720 is to be shifted to the right so that the least significant bit of the integer 720 has the predetermined value. The shift register 715 then performs the logical shift operation by shifting bits of the integer 720 to the right by the determined number of bits in a clock cycle.

In various embodiments, the logic circuit 710 including the shift register 715 is faster or smaller than embodiments of the logic circuit 710 without the shift register 715. For example, an embodiment of the logic circuit 710 including the shift register 715 may have a shorter propagation delay than an embodiment of the logic circuit 710 without the shift register 715. As a result, the syndrome sequencer 120 may operate at a faster clock rate in embodiments in which the logic circuit 710 includes the shift register 715. As another example, the embodiment of the logic circuit 710 including the shift register 715 may consume less area in an integrated circuit than an embodiment of the logic circuit 710 without the shift register 715. In various embodiments, the logic circuit 710 including the shift register 715 consumes less power than embodiments of the logic circuit 710 without the shift register 715.

In various embodiments, the initial value of an integer 720 generated by the counter 725 and the final value of an integer 720 generated by the counter 725 are programmable. For example, the syndrome sequencer 120 may select the initial value and the final value based on user input to the syndrome sequencer 120. In some embodiments, the register identifiers 150 generated by the logic circuit 710 are odd integers. In these embodiments, the predetermined value in the least significant bit position of valid register identifiers 150 is one. In other embodiments, the register identifiers 150 generated by the logic circuit 710 are even integers. In these embodiments, the predetermined value in the least significant bit position of valid register identifiers 150 is zero.

Table 1 illustrates exemplary integers 720 generated by the counter 725 and corresponding register identifiers 150 generated by the logic circuit 710 for an embodiment of the locator polynomial generator 105. In this embodiment, valid register identifiers 150 generated by the logic circuit 710 are odd integers. The exemplary integers 720 and the exemplary register identifiers 150 illustrated in Table 1 are shown in binary format.

TABLE 1

| Integer | Register Identifier |
|---------|---------------------|
| 000     | 000                 |
| 001     | 001                 |
| 010     | 001                 |
| 011     | 011                 |

TABLE 1-continued

| Integer | Register Identifier |
|---|---|
| 100 | 001 |
| 101 | 101 |
| 110 | 011 |
| 111 | 111 |

In this embodiment, the counter 725 generates an integer 720 having a value of zero upon reset of the counter 725 and increments the integer 720 in successive clock cycles of a clock signal in the syndrome sequencer 120 until counter 725 generates the integer 720 having a final value of seven. As illustrated in Table 1, the logic circuit 710 generates a register identifier 150 having a value of zero when the integer 720 generated by the counter 725 is zero. In this case, the register identifier 150 is invalid and does not identify a register 145 storing a syndrome in the syndrome storage 115. For positive integer values of the integer 720, the logic circuit 710 generates register identifiers 150 having odd integer values, each of which is valid and identifies a register 145 storing a syndrome in the syndrome storage 115. The sequence of register identifiers 150 determines a sequential order in which the syndrome sequencer 120 reads syndromes from the registers 145 of the syndrome storage 115.

Table 2 illustrates the exemplary integers 720 generated by the counter 725 and the corresponding register identifiers 150 generated by the logic circuit 710 in this embodiment. In contrast to table 1 in which the integers 720 and the register identifiers 150 are shown in binary format, the integers 720 and the register identifiers 150 are shown in decimal format in Table 2.

TABLE 2

| Integer | Register Identifier |
|---|---|
| 0 | 0 |
| 1 | 1 |
| 2 | 1 |
| 3 | 3 |
| 4 | 1 |
| 5 | 5 |
| 6 | 3 |
| 7 | 7 |

Table 3 illustrates exemplary integers 720 generated by the counter 725 and corresponding register identifiers 150 generated by the logic circuit 710 for another embodiment of the locator polynomial generator 105. In this embodiment, valid register values 150 generated by the logic circuit 710 are even integers. The exemplary integers 720 and the exemplary register identifiers 150 illustrated in Table 3 are shown in binary format.

TABLE 3

| Integer | Register Identifier |
|---|---|
| 000 | 000 |
| 001 | 000 |
| 010 | 010 |
| 011 | 000 |
| 100 | 100 |
| 101 | 010 |
| 110 | 110 |

In this embodiment, the counter 725 generates an integer 720 having a value of zero upon reset of the counter 725 and increments the integer 720 in successive clock cycles of a clock signal in the syndrome sequencer 120 until counter 725 generates the integer 720 having a final value of six. As illustrated in Table 1, the logic circuit 710 generates a register identifier 150 having a value of zero when the integer 720 generated by the counter 725 is zero. In this case, the register identifier 150 is valid and identifies a register 145 storing a syndrome in the syndrome storage 115. For positive integer values of the integer 720, the logic circuit 710 generates register identifiers 150 having even integer values, each of which is valid and identifies a register 145 storing a syndrome in the syndrome storage 115. The sequence of register identifiers 150 determines a sequential order in which the syndrome sequencer 120 reads syndromes from the registers 145 of the syndrome storage 115.

Table 4 illustrates the exemplary integers 720 generated by the counter 725 and the corresponding register identifiers 150 generated by the logic circuit 710 in this embodiment. In contrast to Table 3 in which the integers 720 and the register identifiers 150 are shown in binary format, the integers 720 and the register identifiers 150 are shown in decimal format in Table 4.

TABLE 4

| Integer | Register Identifier |
|---|---|
| 0 | 0 |
| 1 | 0 |
| 2 | 2 |
| 3 | 0 |
| 4 | 4 |
| 5 | 2 |
| 6 | 6 |

In various embodiments, the syndrome sequencer 120 reads a syndrome 155 from the register 145 identified by the register identifier 150 in the syndrome storage 115 and outputs the syndrome 155 as part of the sequence of syndromes 170. Additionally, the squaring circuit 730 generates an even syndrome 165 by squaring the syndrome 155 read from the syndrome storage 115. For example, the squaring circuit 730 may be a multiplier circuit for generating a product by multiplying a multiplier and a multiplicand. In this example, the syndrome 155 read from the syndrome storage 115 is both the multiplier and the multiplicand of the multiplier circuit, and the even syndrome 165 is the product of the multiplier circuit.

The register 705 stores the register identifier 150 generated by the logic circuit 710 and outputs the register identifier 150 as a register identifier 160. In this way, the register 705 stores a copy of the register identifier 150 generated by the logic circuit 710. Moreover, the syndrome sequencer 120 stores the even syndrome 165 generated by the squaring circuit 730 in the register 145 identified by the register identifier 160 in the syndrome storage 115. In this way, the syndrome sequencer 120 stores the even syndrome 165 into the same register 145 of the syndrome storage 115 from which the syndrome sequencer 120 read the syndrome 155. Moreover, the syndrome sequencer 120 replaces the syndrome 155 with the even syndrome 165 in the register 145.

In some embodiments, the syndrome sequencer 120 reads the syndrome 155 from the syndrome storage 115 in a clock cycle of a clock signal in the syndrome sequencer 120, generates the even syndrome 165 based on the syndrome 155, and writes the even syndrome 165 into the syndrome storage 115 in the succeeding clock cycle of the clock signal. In other embodiments, the syndrome sequencer 120 reads the syndrome 155 from the syndrome storage 115 in a clock cycle of a clock signal in the syndrome sequencer 120, generates the even syndrome 165 based on the syndrome 155, and writes the even syndrome 165 into the syndrome storage 115 in the same clock cycle of the clock signal. For example, the syndrome storage 115 may be a dual-port register file. As another example, the syndrome sequencer 120 may read the syndrome 155 from the syndrome storage 115 on a clock edge (e.g., a rising clock edge) of the clock signal and write the even syndrome 165 into the syndrome storage 115 in an opposite clock edge (e.g., a falling clock edge) of the clock signal.

In some embodiments, the register 705 is optional. In these embodiments, the register identifier 150 is the same as the register identifier 160. In various embodiments, the syndrome sequencer 120 generates a read signal corresponding to the register identifier 150 for indicating when the syndrome sequencer 120 reads a syndrome from the syndrome storage 115 based on the register identifier 150. Additionally, the syndrome sequencer 120 generates a write signal corresponding to the register identifier 160 for indicating when the syndrome sequencer 120 writes a syndrome into the syndrome storage 115 based on the register identifier 160.

Figure 8:
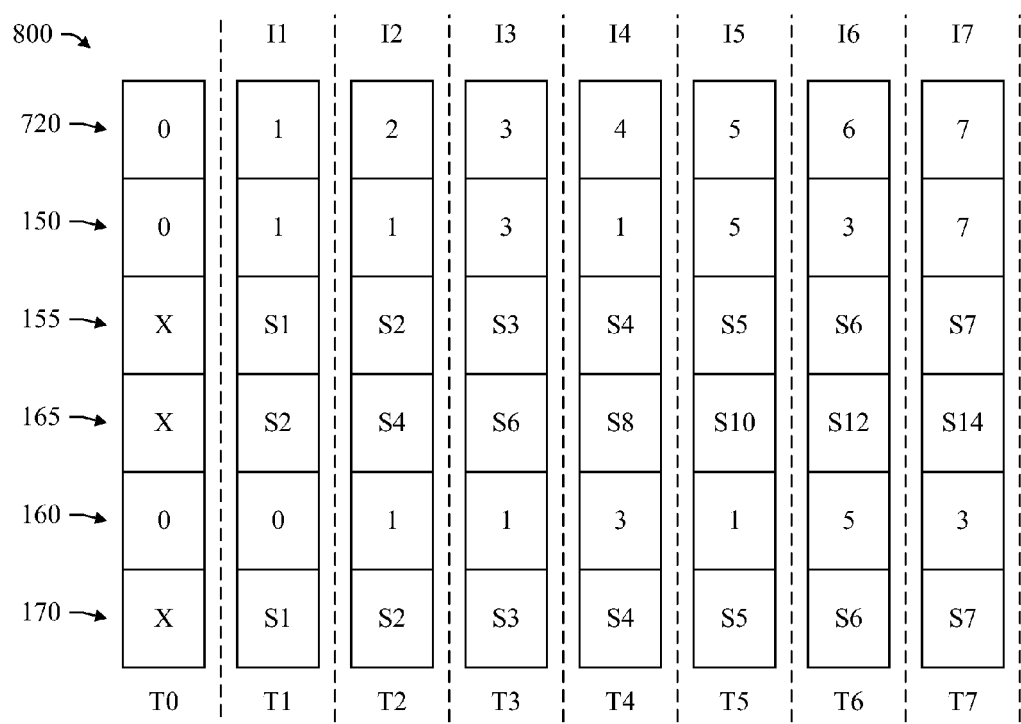
FIG. 8 is a timing diagram for a syndrome sequencer, in accordance with an embodiment of the present invention.

FIG. 8 illustrates a timing diagram 800 for the syndrome sequencer 120, in accordance with an embodiment of the present invention. The timing diagram 800 illustrates operation of the syndrome sequencer 120 for the exemplary sequence of syndromes 170 illustrated in FIG. 3 and the exemplary registers 145 illustrated in FIGS. 6A-6G. Moreover, the timing diagram 800 illustrates operation of the syndrome sequencer 120 over a sequence of iterations (i.e., iterations I1-I7) defined by a corresponding sequence of time periods (i.e., T1-T7) after the syndrome generator 110 has written the odd syndromes 140 into the syndrome storage 115. For example, an iteration in the sequence of iterations may be defined by a clock cycle of a clock signal in the syndrome sequencer 120 or successive clock cycles of the clock signal. The timing diagram 800 shows the state of the syndrome sequencer 120 within each of the time periods (i.e., T1-T7). Moreover, the iterations of the sequence of iterations have a one-to-one correspondence with the syndromes in the sequence of syndromes 170.

In time period T0, the syndrome sequencer 120 is an initial state (e.g., a reset state). In the initial state, the counter 725 generates an integer 720 having a value of zero. The logic circuit 710 generates a register identifier 150 having a value zero, which is invalid because the syndrome storage 115 does not have a register 145 identified by a value of zero. Because the register identifier 150 is invalid, the syndrome 155 and the even syndrome 165 are both invalid (e.g., unknown) in the initial state. Moreover, the syndrome sequencer 120 outputs an invalid syndrome in the sequence of syndromes 170. The register 705 generates the register identifier 160 having a value of zero. Because the register identifier 160 is invalid, the syndrome sequencer 120 does not store the even syndrome 165 into the syndrome storage 115. At the end of the initial state, the register 145a stores the syndrome S1, the register 145b stores the syndrome S3, the register 145c stores the syndrome S5, and the register 145d stores the syndrome S7, as is illustrated in FIG. 6A.

In some embodiments, the syndrome sequencer 120 generates a validity indicator indicating whether a syndrome output from the syndrome sequencer 120 in the sequence of syndromes 170 is a valid syndrome or an invalid syndrome. In these embodiments, the syndrome sequencer 120 provides the validity indicator to the sequential polynomial generator 125. In turn, sequential polynomial generator 125 discards (e.g., ignores) invalid syndromes in the sequence of syndromes 170 based on the validity indicator.

In a first iteration I1 of the sequence of iterations occurring in the time period T1, the counter 725 generates an integer 720 having a value of one, the logic circuit 710 generates a register identifier 150 having a value of one, and the register 705 generates a register identifier 160 having a value of zero. The syndrome sequencer 120 identifies the register 145a based on the register identifier 150, reads the syndrome 155 (i.e., S1) stored in the register 145a, and outputs the syndrome 155 (i.e., S1) as part of the sequence of syndromes 170 generated by the syndrome sequencer 120. The squaring circuit 730 generates the even syndrome 165 (i.e., S2) by squaring the syndrome 155 (i.e., S1). At the end of the first iteration I1, the register 145a stores the syndrome S1, the register 145b stores the syndrome S3, the register 145c stores the syndrome S5, and the register 145d stores the syndrome S7, as is illustrated in FIG. 6A.

In a second iteration I2 of the sequence of iterations occurring in the time period T2, the counter 725 generates an integer 720 having a value of two, the logic circuit 710 generates a register identifier 150 having a value of one, and the register 705 generates a register identifier 160 having a value of one. The syndrome sequencer 120 identifies the register 145a based on the register identifier 160, and writes the even syndrome 165 (i.e., S2) into the register 145a. Additionally, the syndrome sequencer 120 identifies the register 145a based on the register identifier 150, reads the syndrome 155 (i.e., S2) stored in the register 145a, and outputs the syndrome 155 (i.e., S2) as part of the sequence of syndromes 170 generated by the syndrome sequencer 120. The squaring circuit 730 generates the even syndrome 165 (i.e., S4) by squaring the syndrome 155 (i.e., S2). At the end of the second iteration I2, the register 145a stores the syndrome S2, the register 145b stores the syndrome S3, the register 145c stores the syndrome S5, and the register 145d stores the syndrome S7, as is illustrated in FIG. 6B.

In a third iteration I3 of the sequence of iterations occurring in the time period T3, the counter 725 generates an integer 720 having a value of three, the logic circuit 710 generates a register identifier 150 having a value of three, and the register 705 generates a register identifier 160 having a value of one. The syndrome sequencer 120 identifies the register 145a based on the register identifier 160, and writes the even syndrome 165 (i.e., S4) into the register 145a. Additionally, the syndrome sequencer 120 identifies the register 145b based on the register identifier 150, reads the syndrome 155 (i.e., S3) stored in the register 145b, and outputs the syndrome 155 (i.e., S3) as part of the sequence of syndromes 170 generated by the syndrome sequencer 120. The squaring circuit 730 generates the even syndrome 165 (i.e., S6) by squaring the syndrome 155 (i.e., S3). At the end of the third iteration I3, the register 145a stores the syndrome S4, the register 145b stores the syndrome S3, the register 145c stores the syndrome S5, and the register 145d stores the syndrome S7, as is illustrated in FIG. 6C.

In a fourth iteration I4 of the sequence of iterations occurring in the time period T4, the counter 725 generates an integer 720 having a value of four, the logic circuit 710 generates a register identifier 150 having a value of one, and the register 705 generates a register identifier 160 having a value of three. The syndrome sequencer 120 identifies the register 145b based on the register identifier 160, and writes the even syndrome 165 (i.e., S6) into the register 145b. Additionally, the syndrome sequencer 120 identifies the register 145a based on the register identifier 150, reads the syndrome 155 (i.e., S4) stored in the register 145a, and outputs the syndrome 155 (i.e., S4) as part of the sequence of syndromes 170 generated by the syndrome sequencer 120. The squaring circuit 730 generates the even syndrome 165 (i.e., S8) by squaring the syndrome 155 (i.e., S4). At the end of the fourth iteration I4, the register 145a stores the syndrome S4, the register 145b stores the syndrome S6, the register 145c stores the syndrome S5, and the register 145d stores the syndrome S7, as is illustrated in FIG. 6D.

In a fifth iteration I5 of the sequence of iterations occurring in the time period T5, the counter 725 generates an integer 720 having a value of five, the logic circuit 710 generates a register identifier 150 having a value of five, and the register 705 generates a register identifier 160 having a value of one. The syndrome sequencer 120 identifies the register 145a based on the register identifier 160, and writes the even syndrome 165 (i.e., S8) into the register 145a. Additionally, the syndrome sequencer 120 identifies the register 145c based on the register identifier 150, reads the syndrome 155 (i.e., S5) stored in the register 145c, and outputs the syndrome 155 (i.e., S5) as part of the sequence of syndromes 170 generated by the syndrome sequencer 120. The squaring circuit 730 generates the even syndrome 165 (i.e., S10) by squaring the syndrome 155 (i.e., S5). At the end of the fifth iteration I5, the register 145a stores the syndrome S8, the register 145b stores the syndrome S6, the register 145c stores the syndrome S5, and the register 145d stores the syndrome S7, as is illustrated in FIG. 6E.

In a sixth iteration I6 of the sequence of iterations occurring in the time period T6, the counter 725 generates an integer 720 having a value of six, the logic circuit 710 generates a register identifier 150 having a value of three, and the register 705 generates a register identifier 160 having a value of five. The syndrome sequencer 120 identifies the register 145c based on the register identifier 160, and writes the even syndrome 165 (i.e., S10) into the register 145c. Additionally, the syndrome sequencer 120 identifies the register 145b based on the register identifier 150, reads the syndrome 155 (i.e., S6) stored in the register 145b, and outputs the syndrome 155 (i.e., S6) as part of the sequence of syndromes 170 generated by the syndrome sequencer 120. The squaring circuit 730 generates the even syndrome 165 (i.e., S12) by squaring the syndrome 155 (i.e., S6). At the end of the sixth iteration I6, the register 145a stores the syndrome S8, the register 145b stores the syndrome S6, the register 145c stores the syndrome S10, and the register 145d stores the syndrome S7, as is illustrated in FIG. 6F.

In a seventh iteration I7 of the sequence of iterations occurring in the time period T7, the counter 725 generates an integer 720 having a value of seven, the logic circuit 710 generates a register identifier 150 having a value of seven, and the register 705 generates a register identifier 160 having a value of three. The syndrome sequencer 120 identifies the register 145b based on the register identifier 160, and writes the even syndrome 165 (i.e., S12) into the register 145b. Additionally, the syndrome sequencer 120 identifies the register 145d based on the register identifier 150, reads the syndrome 155 (i.e., S7) stored in the register 145d, and outputs the syndrome 155 (i.e., S7) as part of the sequence of syndromes 170 generated by the syndrome sequencer 120. The squaring circuit 730 generates the even syndrome 165 (i.e., S14) by squaring the syndrome 155 (i.e., S7). At the end of the seventh iteration I7, the register 145a stores the syndrome S8, the register 145b stores the syndrome S12, the register 145c stores the syndrome S10, and the register 145d stores the syndrome S7, as is illustrated in FIG. 6G.

In some embodiments, the syndrome sequencer 120 does not store an even syndrome 165 into the syndrome storage 115 if the even syndrome 165 is not part of the sequence of syndromes 170 generated by the syndrome sequencer 120. For example, the syndrome sequencer 120 may not store the syndromes S8, S10, S12, and S14 into the syndrome storage 115. In some embodiments, the syndrome sequencer 120 does not generate an even syndrome 165 that is not in the sequence of syndromes 170. For example, the syndrome sequencer 120 may not generate the syndromes S8, S10, S12, and S14.

Figure 9:
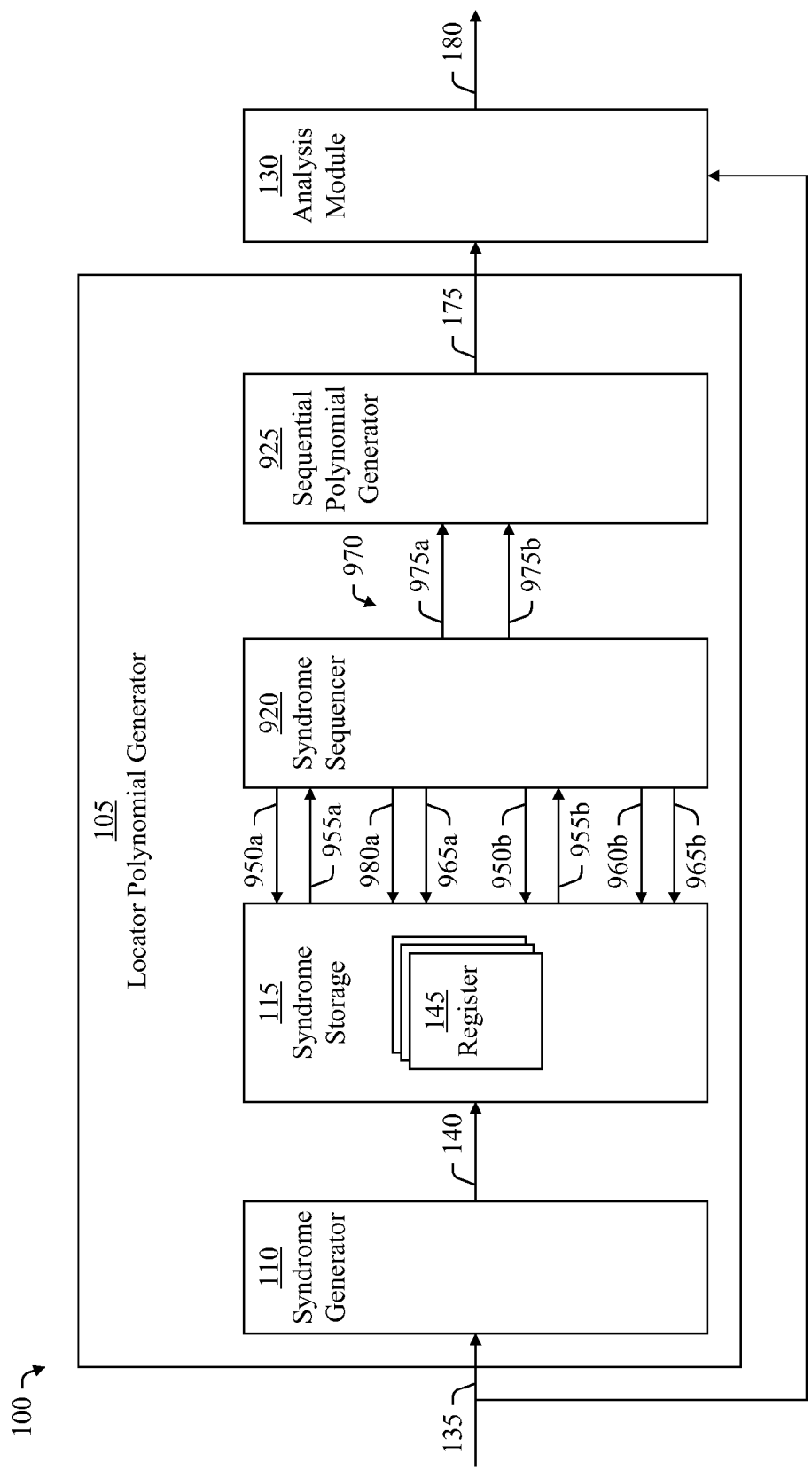
FIG. 9 is a block diagram of a locator polynomial generator, in accordance with an embodiment of the present invention.

FIG. 9 illustrates the locator polynomial generator 105, in accordance with an embodiment of the present invention. The locator polynomial generator 105 includes the syndrome generator 110, the syndrome storage 115, a syndrome sequencer 920, and a sequential polynomial generator 925. The syndrome storage 115 is coupled (e.g., connected) to the syndrome generator 110 and the syndrome sequencer 920. The sequential polynomial generator 925 is coupled (e.g., connected) to the syndrome sequencer 920 and the analysis module 130.

The syndrome sequencer 920 generates a register identifier 950a, reads a syndrome 955a stored in a register 145 of the syndrome storage 115 based on the register identifier 950a, and outputs the syndrome 955a to the sequential polynomial generator 925 as part of a sequence of odd syndromes 775a for use in generating the locator polynomial 175, as is described more fully herein. Additionally, the syndrome sequencer 920 generates a register identifier 950b, reads a syndrome 955b stored in a register 145 of the syndrome storage 115 based on the register identifier 950b, and outputs the syndrome 955b to the sequential polynomial generator 925 as part of a sequence of even syndromes 775b for use in generating the locator polynomial 175, as is also described more fully herein.

The syndrome sequencer 920 generates an even syndrome 965a based on the syndrome 955a read from the syndrome storage 115, and generates a register identifier 960a by copying the register identifier 950a. The syndrome sequencer 920 replaces the syndrome 155a stored in the syndrome storage 115 with the even syndrome 965a by writing the even syndrome 965a into the register 145 of the syndrome storage 115 identified by register identifier 960a. Additionally, the syndrome sequencer 920 generates an even syndrome 965b based on the syndrome 955b read from the syndrome storage 115, and generates a register identifier 960b by copying the register identifier 950b. The syndrome sequencer 920 replaces the syndrome 155b stored in the syndrome storage 115 with the even syndrome 965b by writing the even syndrome 965b into the register 145 of the syndrome storage 115 identified by register identifier 960b. In this way, the syndrome sequencer 920 generates each of the even syndromes of the sequence of syndromes 970, and writes the even syndromes of the sequence of syndromes 970 into the syndrome storage 115. In various embodiments, the syndrome sequencer 920 writes both the even syndrome 965a and the even syndrome 965b into the syndrome storage 115 substantially simultaneously (e.g., in a same iteration or a same clock cycle). In this way, the syndrome sequencer 920 concurrently writes the even syndrome 965a and the even syndrome 965b into the syndrome storage 115.

In this embodiment, the syndrome sequencer 920 reads syndromes 155 (i.e., even syndromes and odd syndromes) from the syndrome storage 115 in a sequential order. Further, the syndrome sequencer 920 outputs the syndromes 155 read from the syndrome storage 115 to the sequential polynomial generator 925 in the same sequential order. In this way, the syndrome sequencer 920 outputs a sequence of syndromes 970 to the sequential polynomial generator 925 in a sequential order of the sequence of syndromes 970.

The syndrome sequencer 920 outputs the sequence of syndromes 970 to the sequential polynomial generator 925 by outputting the sequence of odd syndromes 775a and the sequence of even syndromes 775b to the sequential polynomial generator 925. Moreover, the sequential polynomial generator 925 receives the sequence of syndromes 970 in the sequential order of the sequence of syndromes 970 by receiving some of the syndromes of the sequence of syndromes 970 individually and receiving other syndromes of the sequence of syndromes 970 as a pair of successive syndromes in the sequence of syndromes 970. For example, the sequential polynomial generator 925 may receive a pair of successive syndromes by receiving an odd syndrome of the sequence of odd syndromes 775a and an even syndrome of the sequence of even syndromes 775b.

The sequential polynomial generator 925 generates a sequence of polynomials based on the sequence of syndromes 970 received from the syndrome sequencer 920. The last polynomial of the sequence of polynomials is the locator polynomial 175. Moreover, the sequential polynomial generator 925 generates the locator polynomial 175 by outputting the last polynomial in the sequence of polynomials.

In various embodiments, the sequential polynomial generator 925 generates the sequence of polynomials in a sequence of iterations. In these embodiments, the sequential polynomial generator 925 receives a first syndrome of the sequence of syndromes 970 in a first iteration of the sequence of iterations and generates a first polynomial of the sequence of polynomials in the first iteration based on the first syndrome. In the next iteration (i.e., the succeeding iteration), the sequential polynomial generator 925 receives a pair of successive syndromes of the sequence of syndromes 970, which are the next two syndromes of the sequence of syndromes 970. The sequential polynomial generator 925 generates the next polynomial in the sequence of polynomials based on the polynomial generated in the previous iteration (i.e., the preceding iteration) and the pair of successive syndromes received in the current iteration (i.e., the succeeding iteration). The sequential polynomial generator 925 generates subsequent polynomials in the sequence of polynomials by repeating this process in subsequent iterations of the sequence of iterations until the last iteration of the sequence of iterations is reached.

In the last iteration of the sequence of iterations, the sequential polynomial generator 925 receives a syndrome of the sequence of syndromes 970, which is the second to the last syndrome in the sequence of syndromes 970. The sequential polynomial generator 925 generates the last polynomial in the sequence of polynomials, based on the polynomial generated in the previous iteration (i.e., preceding iteration) and the second to the last syndrome in the sequence of syndromes 970. Moreover, the sequential polynomial generator 925 generates the locator polynomial 175 by outputting the last polynomial in the sequence of polynomials. In this way, the sequential polynomial generator 925 generates the locator polynomial 175 based on an even number of syndromes.

In another embodiment, the sequential polynomial generator 925 receives a pair of successive syndromes in the last iteration. In the embodiment, the pair of successive syndromes includes the second to the last syndrome and the syndrome preceding the second to the last syndrome in the sequence of syndromes 970. The sequential polynomial generator 925 generates the last polynomial in the sequence of polynomials, based on the polynomial generated in the previous iteration (i.e., preceding iteration) and the pair of successive syndromes. Moreover, the sequential polynomial generator 925 generates the locator polynomial 175 by outputting the last polynomial in the sequence of polynomials. In this way, the sequential polynomial generator 925 generates the locator polynomial 175 based on an odd number of syndromes.

FIGS. 10A-10D illustrates the syndrome storage 115, in accordance with an embodiment of the present invention. FIG. 10A illustrates the registers 145 after the syndrome generator 110 has written the odd syndromes 140 into the syndrome storage 115. The odd syndromes 140 include the syndromes S1, S3, S5, and S7 of the sequence of syndromes 970. As illustrated in FIG. 10A, the register 145a contains the syndrome S1, the register 145b contains the syndrome S3, the register 145c contains the syndrome S5, and the register 145d contains the syndrome S7.

FIG. 10A also illustrates the registers 145 after the sequential polynomial generator 925 has completed a first iteration of a sequence of iterations for generating the locator polynomial 175. In the first iteration, the syndrome sequencer 920 reads the syndrome 955a (i.e., S1) stored in the register 145a, outputs the syndrome 955a (i.e., S1) to the sequential polynomial generator 925 as part of the sequence of odd syndromes 775a, and generates the even syndrome 965a (i.e., S2) by squaring the syndrome 955a (i.e., S1) read from the register 145a.

FIG. 10B illustrates the registers 145 after the sequential polynomial generator 925 has completed a second iteration of a sequence of iterations for generating the locator polynomial 175. In the second iteration, the syndrome sequencer 920 replaces the syndrome 955a (i.e., S1) with the even syndrome 965a (i.e., S2) in the register 145a, reads the syndrome 955a (i.e., S3) stored in the register 145b, outputs the syndrome 955a (i.e., S3) to the sequential polynomial generator 925 as part of the sequence of odd syndromes 975a, and generates the even syndrome 965a (i.e., S6) by squaring the syndrome 955a (i.e., S3) read from the register 145b. Additionally, the syndrome sequencer 920 reads the syndrome 955b (i.e., S2) stored in the register 145a, outputs the syndrome 955b (i.e., S2) to the sequential polynomial generator 925 as part of the sequence of even syndromes 975b, and generates the even syndrome 965b (i.e., S4) by squaring the syndrome 955b (i.e., S2) read from the register 145a.

FIG. 10C illustrates the registers 145 after the sequential polynomial generator 925 has completed a third iteration of a sequence of iterations for generating the locator polynomial 175. In the third iteration, the syndrome sequencer 920 replaces the syndrome 955a (i.e., S3) with the even syndrome 965a (i.e., S6) in the register 145b, reads the syndrome 955a (i.e., S5) stored in the register 145c, outputs the syndrome 955a (i.e., S5) to the sequential polynomial generator 925 as part of the sequence of odd syndromes 975a, and generates the even syndrome 965a (i.e., S10) by squaring the syndrome 955a (i.e., S5) read from the register 145b. Additionally, the syndrome sequencer 920 replaces the syndrome 955b (i.e., S2) with the even syndrome 965b (i.e., S4) in the register 145a, reads the syndrome 955b (i.e., S4) stored in the register 145a, outputs the syndrome 955b (i.e., S4) to the sequential polynomial generator 925 as part of the sequence of even syndromes 975b, and generates the even syndrome 965b (i.e., S8) by squaring the syndrome 955b (i.e., S4) read from the register 145a.

FIG. 10D illustrates the registers 145 after the sequential polynomial generator 925 has completed a fourth iteration of a sequence of iterations for generating the locator polynomial 175. In the fourth iteration, the syndrome sequencer 920 replaces the syndrome 955a (i.e., S5) with the even syndrome 965a (i.e., S10) in the register 145c, reads the syndrome 955a (i.e., S7) stored in the register 145d, outputs the syndrome 955$a$ (i.e., S7) to the sequential polynomial generator 925 as part of the sequence of odd syndromes 975$a$, and generates the even syndrome 965$a$ (i.e., S14) by squaring the syndrome 955$a$ (i.e., S7) read from the register 145$d$. Additionally, the syndrome sequencer 920 replaces the syndrome 955$b$ (i.e., S4) with the even syndrome 965$b$ (i.e., S8) in the register 145$a$, reads the syndrome 955$b$ (i.e., S6) stored in the register 145$b$, outputs the syndrome 955$b$ (i.e., S6) to the sequential polynomial generator 925 as part of the sequence of even syndromes 975$b$, and generates the even syndrome 965$b$ (i.e., S12) by squaring the syndrome 955$b$ (i.e., S6) read from the register 145$b$.

In some embodiments, the syndrome sequencer 920 does not store an even syndrome 965 into the syndrome storage 115 if the even syndrome 965 is not part of the sequence of syndromes 970 generated by the syndrome sequencer 920. For example, the syndrome sequencer 920 may not store the syndromes S8, S10, S12, and S14 into the syndrome storage 115. In some embodiments, the syndrome sequencer 920 does not generate an even syndrome 965 that is not in the sequence of syndromes 970. For example, the syndrome sequencer 920 may not generate the syndromes S8, S10, S12, and S14.

Figure 11:
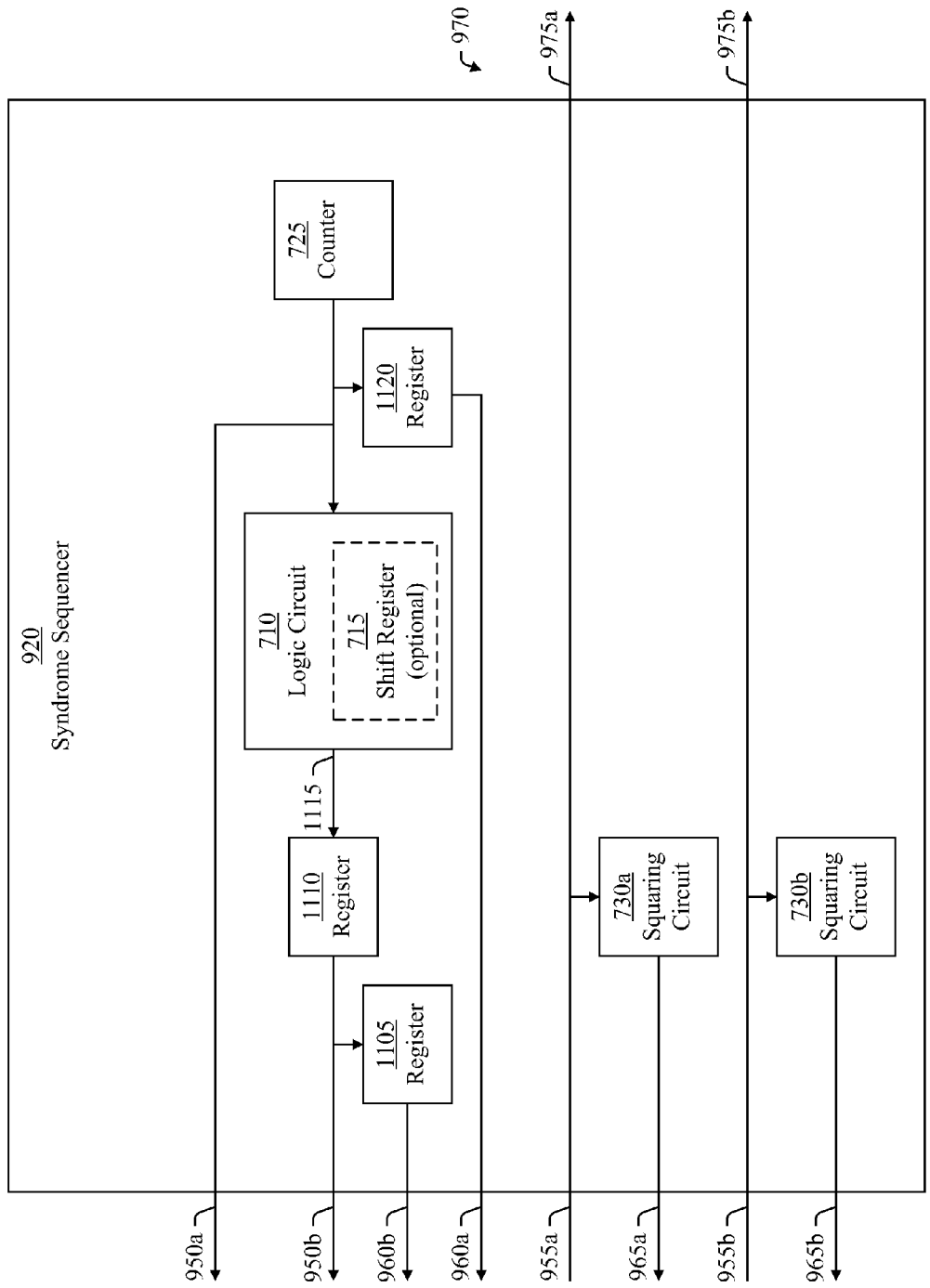
FIG. 11 is a block diagram of a syndrome sequencer, in accordance with an embodiment of the present invention.

FIG. 11 illustrates the syndrome sequencer 920, in accordance with an embodiment of the present invention. The syndrome sequencer 920 includes a register 1105, a register 1110, the logic circuit 710, the counter 725, a register 1120, and two squaring circuits 730 (i.e., squaring circuits 730$a$ and 730$b$). The logic circuit 710 is coupled (e.g., connected) to the register 1110, the counter 725, and the register 1120. The register 1105 is coupled (e.g., connected) to the register 1110. Additionally, the counter 725 is coupled (e.g., connected) to the register 1120. The counter 725 generates integers and outputs the integers to the logic circuit 710, as is described more fully herein. In this embodiment, the counter 725 outputs the integers as register identifiers 950$a$.

The logic circuit 710 receives an integer by receiving a register identifier 950$a$ generated by the counter 725 and generates a register identifier 1115 by performing a logic operation on the integer. In turn, the register 1110 stores the register identifier 1115 and outputs the register identifier 1115 as a register identifier 950$b$. In this way, the register 1110 stores a copy of the register identifier 1115 generated by the logic circuit 710. The register 1105 stores the register identifier 950$b$ and outputs the register identifier 950$b$ as the register identifier 960$b$. In this way, the register 1105 stores a copy of the register identifier 950$b$ generated by the register 1110. The register 1120 stores the register identifier 950$a$ generated by the counter 725 and outputs the register identifier 950$a$ as the register identifier 960$a$. In this way, the register 1120 stores a copy of the register identifier 950$a$ generated by counter 725.

In various embodiments, the syndrome sequencer 920 reads a syndrome 955$a$ from the register 145 identified by the register identifier 950$a$ in the syndrome storage 115 and outputs the syndrome 955$a$ as part of the sequence of odd syndromes 975$a$. The squaring circuit 730$a$ generates an even syndrome 965$a$ by squaring the syndrome 955$a$ read from the syndrome storage 115. In turn, the syndrome sequencer 920 replaces the syndrome 955$a$ with the even syndrome 965$a$ in the syndrome storage 115 by writing the even syndrome 965$a$ into the register 145 identified by the register identifier 960$a$.

Additionally, the syndrome sequencer 920 reads a syndrome 955$b$ from the register 145 identified by the register identifier 950$b$ in the syndrome storage 115 and outputs the syndrome 955$b$ as part of the sequence of even syndromes 975$b$. The squaring circuit 730$b$ generates an even syndrome 965$b$ by squaring the syndrome 955$b$ read from the syndrome storage 115. In turn, the syndrome sequencer 920 replaces the syndrome 955$b$ with the even syndrome 965$b$ in the syndrome storage 115 by writing the even syndrome 965$b$ into the register 145 identified by the register identifier 960$b$.

In some embodiments, the syndrome sequencer 920 reads a syndrome (i.e., a syndrome 955$a$ or 955$b$) from the syndrome storage 115 in a clock cycle of a clock signal in the syndrome sequencer 920, generates an even syndrome 965 (i.e., an even syndrome 965$a$ or 965$b$) based on the syndrome 955 read from the syndrome storage 115, and writes the even syndrome 965 into the syndrome storage 115 in the succeeding clock cycle of the clock signal. In other embodiments, the syndrome sequencer 920 reads a syndrome 955 (i.e., a syndrome 955$a$ or 955$b$) from the syndrome storage 115 in a clock cycle of a clock signal in the syndrome sequencer 920, generates an even syndrome 965 (i.e., an even syndrome 965$a$ or 965$b$) based on the syndrome 955 read from the syndrome storage 115, and writes the even syndrome 965 into the syndrome storage 115 in the same clock cycle of the clock signal.

In some embodiments, the register 1120 is optional. In these embodiments, the register identifier 950$a$ is the same as the register identifier 960$a$. In various embodiments, the syndrome sequencer 920 generates a read signal corresponding to the register identifier 950$a$ for indicating when the syndrome sequencer 920 reads a syndrome from the syndrome storage 115 based on the register identifier 950$a$. Additionally, the syndrome sequencer 920 generates a write signal corresponding to the register identifier 960$a$ for indicating when the syndrome sequencer 920 writes a syndrome into the syndrome storage 115 based on the register identifier 960$a$.

In some embodiments, the register 1105 is optional. In these embodiments, the register identifier 950$b$ is the same as the register identifier 960$b$. In some embodiments, the register 1110 is optional. In these embodiments, the register identifier 950$b$ is the same as the register identifier 1115. In various embodiments, the syndrome sequencer 920 generates a read signal corresponding to the register identifier 950$b$ for indicating when the syndrome sequencer 920 reads a syndrome from the syndrome storage 115 based on the register identifier 950$b$. Additionally, the syndrome sequencer 920 generates a write signal corresponding to the register identifier 960$b$ for indicating when the syndrome sequencer 920 writes a syndrome into the syndrome storage 115 based on the register identifier 960$b$.

In various embodiments, the syndrome sequencer 920 reads both the syndrome 955$a$ and the syndrome 955$b$ from the syndrome storage 115 substantially simultaneously (e.g., in a same iteration or a same clock cycle). In this way, the syndrome sequencer 920 concurrently reads the syndrome 955$a$ and the syndrome 955$b$ from the syndrome storage 115. In various embodiments, the syndrome sequencer 920 writes both the even syndrome 965$a$ and the even syndrome 965$b$ into the syndrome storage 115 substantially simultaneously (e.g., in a same iteration or a same clock cycle). In this way, the syndrome sequencer 920 concurrently writes the even syndrome 965$a$ and the even syndrome 965$b$ into the syndrome storage 115.

Figure 12:
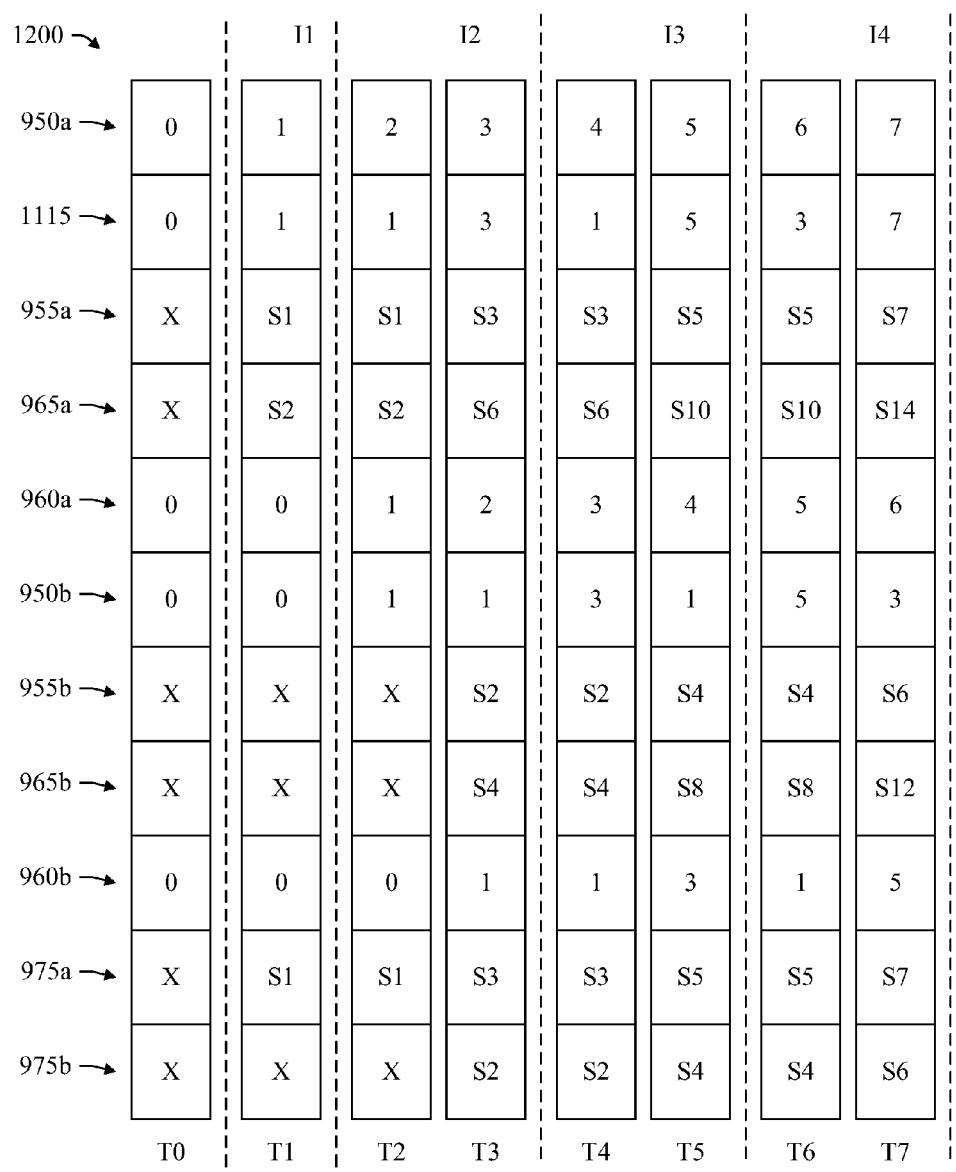
FIG. 12 is a timing diagram for a syndrome sequencer, in accordance with an embodiment of the present invention.

FIG. 12 illustrates a timing diagram 1200 for a syndrome sequencer, in accordance with an embodiment of the present invention. The timing diagram 1200 illustrates operation of the syndrome sequencer 920 for the exemplary sequence of syndromes 170 illustrated in FIG. 3 and the exemplary registers 145 illustrated in FIGS. 10A-10D after the syndrome generator 110 has written the odd syndromes 140 into the syndrome storage 115. Moreover, the timing diagram 1200 illustrates operation of the syndrome sequencer 920 over a sequence of iterations (i.e., I1-I4) performed in a sequence of time periods (i.e., T1-T7). For example, an iteration in the sequence of iterations may be defined by a clock cycle of a clock signal in the syndrome sequencer 920 or successive clock cycles of the clock signal. The timing diagram 1200 shows the state of the syndrome sequencer 920 within each of the time periods (i.e., T1-T7).

In this embodiment, at least one iteration (e.g., I1) of the sequence of iterations is performed in a single time period of the sequence of time periods and at least one iteration (e.g., I2, I3, and I4) of the sequence of iterations is performed in two successive time period of the sequence of time periods. In various embodiments, an iteration performed in a single time period (e.g., T1) is a read cycle. In these embodiments, the first time period (e.g., T2, T4, or T6) of an iteration that is performed in two successive time periods is a write cycle, and the second time period (e.g., T3, T5, or T7) of the iteration is a read cycle.

In time period T0, the syndrome sequencer 920 is an initial state (e.g., a reset state). In the initial state, the counter 725 generates a register identifier 950a having a value of zero, which is invalid because the syndrome storage 115 does not have a register 145 identified by a value of zero. Because the register identifier 950a is invalid, the syndrome 955a and the even syndrome 965a are both invalid (e.g., unknown) in the initial state. Moreover, the syndrome sequencer 920 outputs an invalid syndrome in the sequence of odd syndromes 975a. The register 1120 generates a register identifier 960a having a value of zero based on the register identifier 950a output from the counter 725. Because the register identifier 960a is invalid, the syndrome sequencer 920 does not store the even syndrome 965a into the syndrome storage 115.

In some embodiments, the syndrome sequencer 920 generates a validity indicator indicating whether a syndrome output from the syndrome sequencer 920 in the sequence of odd syndromes 975a is a valid syndrome or an invalid syndrome. In these embodiments, syndrome sequencer 920 provides the validity indicator to the sequential polynomial generator 925. In turn, sequential polynomial generator 925 discards (e.g., ignores) invalid syndromes in the sequence of odd syndromes 975a based on the validity indicator. Additionally, the syndrome sequencer 920 generates a validity indicator indicating whether a syndrome output from the syndrome sequencer 920 in the sequence of even syndromes 975b is a valid syndrome or an invalid syndrome. In these embodiments, syndrome sequencer 920 provides the validity indicator to the sequential polynomial generator 925. In turn, sequential polynomial generator 925 discards invalid syndromes in the sequence of even syndromes 975b based on the validity indicator.

In some embodiments, the syndrome sequencer 920 generates a validity indicator indicating whether the syndrome output as part of the sequence of odd syndromes 975a is valid or invalid. In these embodiments, the sequential polynomial generator 925 discards (e.g., ignores) both the syndrome received as part of the sequence of odd syndromes 975a and the syndrome received as part of the sequence of even syndromes 975b when the validity indicator indicates the syndrome output as part of the sequence of odd syndromes 975a is invalid. Moreover, the sequential polynomial generator 925 deletes (e.g., ignores) the syndrome received as part of the sequence of even syndromes 975b in a first iteration of the sequence of iterations.

Also in the time period T0, the logic circuit 710 generates a register identifier 1115 having a value of zero based on the register identifier 950a generated by the counter 725. In turn, the register 1110 generates a register identifier 950b having a value of zero based on the register identifier 1115 generated by the logic circuit 710. The register identifier 950b is invalid because the syndrome storage 115 does not have a register 145 identified by a value of zero. Because the register identifier 950b is invalid, the syndrome 955b and the even syndrome 965b are both invalid in the initial state. Moreover, the syndrome sequencer 920 outputs an invalid syndrome in the sequence of even syndromes 975b. The register 1105 generates a register identifier 960b having a value of zero based on the register identifier 950b output from the register 1110. Because the register identifier 960b is invalid, the syndrome sequencer 920 does not store the even syndrome 965b into the syndrome storage 115. At the end of the initial state, the register 145a stores the syndrome S1, the register 145b stores the syndrome S3, the register 145c stores the syndrome S5, and the register 145d stores the syndrome S7, as is illustrated in FIG. 10A.

The first iteration I1 of the sequence of iterations occurs in the time period T1. In the time period T1, the counter 725 generates a register identifier 950a having a value of one and the logic circuit 710 generates a register identifier 1115 having a value of one. The syndrome sequencer 920 identifies the register 145a based on the register identifier 950a, reads the syndrome 955a (i.e., S1) stored in the register 145a, and outputs the syndrome 955a (i.e., S1) as part of the sequence of odd syndromes 975a generated by the syndrome sequencer 920. The squaring circuit 730a generates the even syndrome 965a (i.e., S2) by squaring the syndrome 955a (i.e., S1). The register 1120 generates a register identifier 960a having a value of zero.

Also in the time period T1, the register 1110 generates the register identifier 950b having a value of zero. The register identifier 950b is invalid because the syndrome storage 115 does not have a register 145 identified by a value of zero. Because the register identifier 950b is invalid, the syndrome 955b and the even syndrome 965b are both invalid in the initial state. Moreover, the syndrome sequencer 920 outputs an invalid syndrome in the sequence of even syndromes 975b. Additionally, the register 1105 generates a register identifier 960b having a value of zero. At the end of the first iteration I1, the register 145a stores the syndrome S1, the register 145b stores the syndrome S3, the register 145c stores the syndrome S5, and the register 145d stores the syndrome S7, as is illustrated in FIG. 10A.

A second iteration I2 of the sequence of iterations occurs in the time periods T2 and T3. In the time period T2, the counter 725 generates a register identifier 950a having a value of two and the logic circuit 710 generates a register identifier 1115 having a value of one. Because the time period T2 is the first time period in the second iteration I2, the syndrome sequencer 920 does not read a syndrome 955a from the register 145 identified by register identifier 950a. As a result, the syndrome 955a remains the same as the syndrome 995a (i.e., S1) generated at the end of the first iteration I1. Moreover, the syndrome sequencer 920 outputs the syndrome 955a (i.e., S1) as part of the sequence of odd syndromes 975a generated by the syndrome sequencer 920. The squaring circuit 730a generates the even syndrome 965a (i.e., S2) by squaring the syndrome 955a (i.e., S1). Additionally, the register 1120 generates a register identifier 960a having a value of one. The syndrome sequencer 920 identifies the register 145a based on the register identifier 960a and writes the even syndrome 965a (i.e., S2) into the register 145a.

Also in the time period T2, the register 1110 generates the register identifier 950b having a value of one. Because the time period T2 is the first time period in the second iteration I2, the syndrome sequencer 920 does not read a syndrome 955b from the register 145 identified by register identifier 950b. As a result, the syndrome 955b remains the same as the syndrome 995b (i.e., an invalid syndrome) generated at the end of the first iteration I2, and the syndrome sequencer 920 outputs an invalid syndrome as part of the sequence of even syndromes 975b generated by the syndrome sequencer 920. Moreover, the even syndrome 965b (i.e., an invalid syndrome) remains the same as the even syndrome 965b generated at the end of the first iteration I1. Additionally, the register 1105 generates the register identifier 960b having a value of zero. At the end of the time period T2, the register 145a stores the syndrome S2, the register 145b stores the syndrome S3, the register 145c stores the syndrome S5, and the register 145d stores the syndrome S7, as is illustrated in FIG. 10B.

In the time period T3, the counter 725 generates a register identifier 950a having a value of three and the logic circuit 710 generates a register identifier 1115 having a value of three. The syndrome sequencer 920 identifies the register 145b based on the register identifier 950a, reads the syndrome 955a (i.e., S3) stored in the register 145b, and outputs the syndrome 955a (i.e., S3) as part of the sequence of odd syndromes 975a generated by the syndrome sequencer 920. The squaring circuit 730b generates the even syndrome 965a (i.e., S6) by squaring the syndrome 955a (i.e., S3). The register 1120 generates a register identifier 960a having a value of two.

Also in the time period T3, the register 1110 generates the register identifier 950b having a value of one. The syndrome sequencer 920 identifies the register 145a based on the register identifier 950b, reads the syndrome 955b (i.e., S2) stored in the register 145a, and outputs the syndrome 955b (i.e., S2) as part of the sequence of even syndromes 975b generated by the syndrome sequencer 920. The squaring circuit 730b generates the even syndrome 965b (i.e., S4) by squaring the syndrome 955b (i.e., S2). The register 1105 generates the register identifier 960b having a value of one. At the end of the second iteration I2, the register 145a stores the syndrome S2, the register 145b stores the syndrome S3, the register 145c stores the syndrome S5, and the register 145d stores the syndrome S7, as is illustrated in FIG. 10B.

A third iteration I3 of the sequence of iterations occurs in the time periods T4 and T5. In the time period T4, the counter 725 generates a register identifier 950a having a value of four and the logic circuit 710 generates a register identifier 1115 having a value of one. Because the time period T4 is the first time period in the third iteration I3, the syndrome sequencer 920 does not read a syndrome 955a from the register 145 identified by register identifier 950a. As a result, the syndrome 955a remains the same as the syndrome 995a (i.e., S3) generated at the end of the second iteration I2. Moreover, the syndrome sequencer 920 outputs the syndrome 955a (i.e., S3) as part of the sequence of odd syndromes 975a generated by the syndrome sequencer 920. The squaring circuit 730a generates the even syndrome 965a (i.e., S6) by squaring the syndrome 955a (i.e., S3). Additionally, the register 1120 generates a register identifier 960a having a value of three. The syndrome sequencer 920 identifies the register 145b based on the register identifier 960a and writes the even syndrome 965a (i.e., S6) into the register 145b.

Also in the time period T4, the register 1110 generates the register identifier 950b having a value of three. Because the time period T4 is the first time period in the third iteration I3, the syndrome sequencer 920 does not read a syndrome 955b from the register 145 identified by register identifier 950b. As a result, the syndrome 955b remains the same as the syndrome 995b (i.e., S2) generated at the end of the second iteration I2, and the syndrome sequencer 920 outputs the syndrome 955b (i.e., S2) as part of the sequence of even syndromes 975b generated by the syndrome sequencer 920.

Additionally, the squaring circuit 730b generates the even syndrome 965b (i.e., S4) by squaring the syndrome 955b (i.e., S2), and the register 1120 generates a register identifier 960b having a value of one. The syndrome sequencer 920 identifies the register 145a based on the register identifier 960a and writes the even syndrome 965b (i.e., S4) into the register 145a. At the end of the time period T4, the register 145a stores the syndrome S4, the register 145b stores the syndrome S6, the register 145c stores the syndrome S5, and the register 145d stores the syndrome S7, as is illustrated in FIG. 10C.

In the time period T5, the counter 725 generates a register identifier 950a having a value of five and the logic circuit 710 generates a register identifier 1115 having a value of five. The syndrome sequencer 920 identifies the register 145c based on the register identifier 950a, reads the syndrome 955a (i.e., S5) stored in the register 145c, and outputs the syndrome 955a (i.e., S5) as part of the sequence of odd syndromes 975a generated by the syndrome sequencer 920. The squaring circuit 730b generates the even syndrome 965a (i.e., S10) by squaring the syndrome 955a (i.e., S5). The register 1120 generates a register identifier 960a having a value of four.

Also in the time period T5, the register 1110 generates the register identifier 950b having a value of one. The syndrome sequencer 920 identifies the register 145a based on the register identifier 950b, reads the syndrome 955b (i.e., S4) stored in the register 145a, and outputs the syndrome 955b (i.e., S4) as part of the sequence of even syndromes 975b generated by the syndrome sequencer 920. The squaring circuit 730b generates the even syndrome 965b (i.e., S8) by squaring the syndrome 955b (i.e., S4). The register 1105 generates the register identifier 960b having a value of three. At the end of the third iteration I3, the register 145a stores the syndrome S4, the register 145b stores the syndrome S6, the register 145c stores the syndrome S5, and the register 145d stores the syndrome S7, as is illustrated in FIG. 10C.

A fourth iteration I4 of the sequence of iterations occurs in the time periods T6 and T7. In the time period T6, the counter 725 generates a register identifier 950a having a value of six and the logic circuit 710 generates a register identifier 1115 having a value of three. Because the time period T6 is the first time period in the fourth iteration I4, the syndrome sequencer 920 does not read a syndrome 955a from the register 145 identified by register identifier 950a. As a result, the syndrome 955a remains the same as the syndrome 995a (i.e., S5) generated at the end of the third iteration I3. Moreover, the syndrome sequencer 920 outputs the syndrome 955a (i.e., S5) as part of the sequence of odd syndromes 975a generated by the syndrome sequencer 920. The squaring circuit 730a generates the even syndrome 965a (i.e., S10) by squaring the syndrome 955a (i.e., S5). Additionally, the register 1120 generates a register identifier 960a having a value of five. The syndrome sequencer 920 identifies the register 145c based on the register identifier 960a and writes the even syndrome 965a (i.e., S10) into the register 145c.

Also in the time period T6, the register 1110 generates the register identifier 950b having a value of five. Because the time period T6 is the first time period in the fourth iteration I4, the syndrome sequencer 920 does not read a syndrome 955b from the register 145 identified by register identifier 950b. As a result, the syndrome 955b remains the same as the syndrome 995b (i.e., S4) generated at the end of the third iteration I3, and the syndrome sequencer 920 outputs the syndrome 955b (i.e., S4) as part of the sequence of even syndromes 975b generated by the syndrome sequencer 920.

Additionally, the squaring circuit 730b generates the even syndrome 965b (i.e., S8) by squaring the syndrome 955b (i.e., S4), and the register 1120 generates a register identifier 960b having a value of one. The syndrome sequencer 920 identifies the register 145a based on the register identifier 960a and writes the even syndrome 965b (i.e., S8) into the register 145a. At the end of the time period T6, the register 145a stores the syndrome S8, the register 145b stores the syndrome S6, the register 145c stores the syndrome S10, and the register 145d stores the syndrome S7, as is illustrated in FIG. 10D.

In the time period T7, the counter 725 generates a register identifier 950a having a value of seven and the logic circuit 710 generates a register identifier 1115 having a value of seven. The syndrome sequencer 920 identifies the register 145d based on the register identifier 950a, reads the syndrome 955a (i.e., S7) stored in the register 145d, and outputs the syndrome 955a (i.e., S5) as part of the sequence of odd syndromes 975a generated by the syndrome sequencer 920. The squaring circuit 730b generates the even syndrome 965a (i.e., S14) by squaring the syndrome 955a (i.e., S7). The register 1120 generates a register identifier 960a having a value of six.

Also in the time period T7, the register 1110 generates the register identifier 950b having a value of three. The syndrome sequencer 920 identifies the register 145b based on the register identifier 950b, reads the syndrome 955b (i.e., S6) stored in the register 145a, and outputs the syndrome 955b (i.e., S6) as part of the sequence of even syndromes 975b generated by the syndrome sequencer 920. The squaring circuit 730b generates the even syndrome 965b (i.e., S12) by squaring the syndrome 955b (i.e., S4). The register 1105 generates the register identifier 960b having a value of five. At the end of the fourth iteration I4, the register 145a stores the syndrome S8, the register 145b stores the syndrome S6, the register 145c stores the syndrome S10, and the register 145d stores the syndrome S7, as is illustrated in FIG. 10D.

In some embodiments, the syndrome sequencer 920 does not store an even syndrome 965 (i.e., an even syndrome 965a or 965b) into the syndrome storage 115 if the even syndrome 965 is not part of the sequence of syndromes 970 generated by the syndrome sequencer 920. For example, the syndrome sequencer 920 may not store the syndromes S8, S10, S12, and S14 into the syndrome storage 115. In some embodiments, the syndrome sequencer 920 does not generate an even syndrome 965 that is not in the sequence of syndromes 970. For example, the syndrome sequencer 920 may not generate the syndromes S8, S10, S12, and S14.

In some embodiments, the squaring circuit 730 (i.e., the squaring circuit 730a or 730b) generates the corresponding even syndrome 965 (i.e., the even syndrome 965a or 965b) in the first time period (e.g. T2) of an iteration instead of the last time period (e.g. T1) of the previous iteration. In some embodiments, the squaring circuit 730 generates the corresponding even syndrome 965 in both the first time period (e.g., T4) of an iteration and the last time period (e.g., T3) of the previous iteration. In this way, the propagation delay of the squaring circuit 730 may be greater than a single time period and may be up to two time periods (i.e., T3 and T4).

In other embodiments, the syndrome sequence 920 includes a single squaring circuit 730. In these embodiments, the squaring circuit 730 generates an even syndrome 965 (e.g., an even syndrome 965a or 965b) in each of two successive time periods (e.g., T3 and T4). For example, the syndrome sequencer 920 may include an additional register for storing an even syndrome 665a generated by the squaring circuit 730 in the last time period (e.g., T3) of an iteration. In this example, the squaring circuit 730 generates an even syndrome 665b in the first time period (e.g., T4) of the next iteration and the syndrome sequencer 920 stores both the even syndrome 665a and the even syndrome 665b into the syndrome storage 115 in the first time period (e.g., T4).

Figure 13:
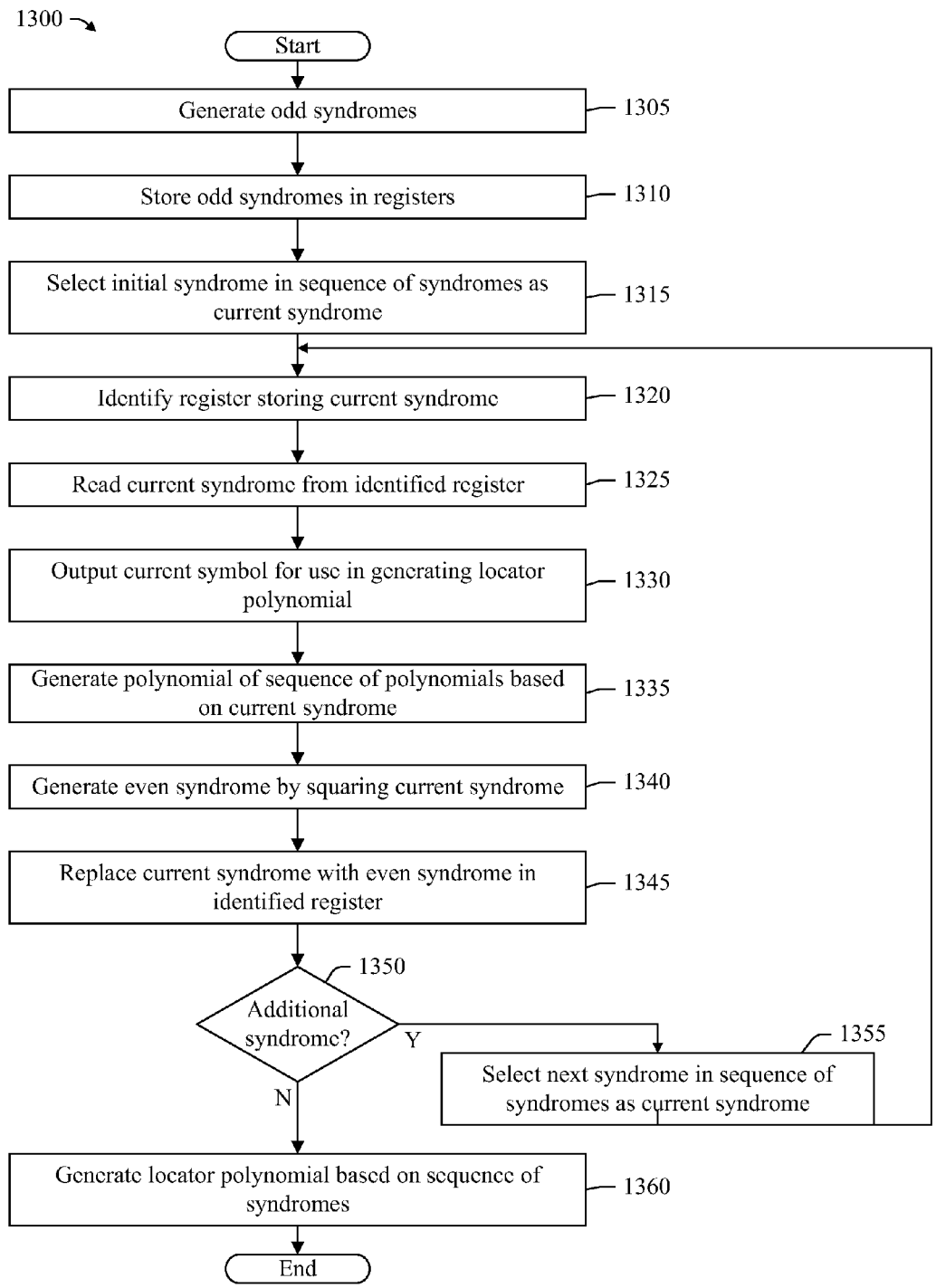
FIG. 13 is a flow chart for a method of generating a locator polynomial, in accordance with an embodiment of the present invention.

FIG. 13 illustrates a method 1300 of generating a locator polynomial, in accordance with an embodiment of the present invention. In step 1305, odd syndromes are generated. In various embodiments, the syndrome generator 110 generates the odd syndromes 140 and writes the odd syndromes 140 into the syndrome storage 115. The method 1300 then proceeds to step 1310.

In step 1310, the odd syndromes are stored in registers. In various embodiments, the syndrome storage 115 stores the odd syndromes 140 in registers 145. The method 1300 then proceeds to step 1315.

In step 1315, an initial syndrome in the sequence of syndromes is selected as a current syndrome. In various embodiments, the syndrome sequencer 120 selects an initial syndrome in the sequence of syndromes 170 as a current syndrome. For example, the counter 725 in the syndrome sequencer 120 may select the initial syndrome by generating an integer 720 indicating the initial syndrome to be generated for the sequence of syndromes 170.

In other embodiments, the syndrome sequencer 920 selects an initial syndrome in the sequence of syndromes 170 as a current syndrome. For example, the counter 725 in the syndrome sequencer 920 may select the initial syndrome by generating a register identifier 950a which is an integer indicating the initial syndrome to be generated for the sequence of syndromes 170. The method 1300 then proceeds to step 1320.

In step 1320, a register storing the current syndrome is identified. In various embodiments, the syndrome sequencer 120 identifies a register 145 of the syndrome storage 115 storing the current syndrome. For example, the syndrome sequencer 120 may generate a register identifier 150 identifying the register 145 of the syndrome storage 115 storing the current syndrome.

In other embodiments, the syndrome sequencer 920 identifies a register 145 of the syndrome storage 115 storing the current syndrome. For example, the syndrome sequencer 920 may generate a register identifier 950 (i.e., a register identifier 950a or 950b) identifying the register 145 of the syndrome storage 115 storing the current syndrome. In these embodiments, the syndrome sequencer 920 may identify two registers 145 each of which stores a current syndrome. The method 1300 then proceeds to step 1325.

In step 1325, the current syndrome is read from the identified register. In various embodiments, the syndrome sequencer 120 reads the current syndrome from the register 145 of the syndrome storage 115 storing the current syndrome. For example, the syndrome sequencer 120 may read the current syndrome by reading a syndrome 155 from the register 145 identified by the register identifier 150.

In other embodiments, the syndrome sequencer 920 reads the current syndrome from the register 145 of the syndrome storage 115 storing the current syndrome. For example, the syndrome sequencer 920 may read the current syndrome by reading a syndrome 955 (i.e., a syndrome 955a or 955b) from the register 145 identified by the register identifier 950 (i.e., the register identifier 950a or 950b). In these embodiments, the syndrome sequencer 920 may read two current syndromes 955a and 955b from corresponding registers 145 identified by register identifiers 950a and 950b. The method 1300 then proceeds to step 1330.

In step 1330, the current syndrome is output for use in generating the locator polynomial. In various embodiments, the syndrome sequencer 120 outputs the current syndrome for use in generating the locator polynomial 175. For example, the syndrome sequencer 120 may output the syndrome 155 as part of the sequence of syndromes 170 generated by the syndrome sequencer 120. In this way, the syndrome sequencer 120 outputs the current syndrome as the syndrome sequencer 120 is generating the sequence of syndromes 170.

In other embodiments, the syndrome sequencer 920 outputs the current syndrome for use in generating the locator polynomial 970. For example, the syndrome sequencer 920 may output the syndrome 955 (i.e., the syndrome 955a or 955b) read from the syndrome storage 115 as part of the sequence of syndromes 970 generated by the syndrome sequencer 920. In this way, the syndrome sequencer 920 outputs the current syndrome as the syndrome sequencer 920 is generating the sequence of syndromes 970. In these embodiments, the syndrome sequencer 920 may output two current syndromes 955a and 955b that are successive syndromes in the sequencer of syndromes 170 being generated by the syndrome sequencer 920. The method 1300 then proceeds to step 1335.

In step 1335, a polynomial of a sequence of polynomials is generated based on the current syndrome. In various embodiments, the sequential polynomial generator 125 generates a polynomial of a sequence of polynomials based on the current syndrome output from the syndrome sequencer 120. In other embodiments, the sequential polynomial generator 925 generates a polynomial of a sequence of polynomials based on a current syndrome output from the syndrome sequencer 920. In these embodiments, the sequential polynomial generator 925 may generate a polynomial of the sequence of polynomials based on the two current syndromes output from the syndrome sequencer 920. The method 1300 then proceeds to step 1340.

In step 1340, an even syndrome is generated by squaring the current syndrome. In various embodiments, the syndrome sequencer 120 generates an even syndrome by squaring the current syndrome. For example, the squaring circuit 730 of the syndrome sequencer 120 may generate the even syndrome 165 by squaring the syndrome 155.

In other embodiments, the syndrome sequencer 920 generates an even syndrome by squaring the current syndrome. For example, a squaring circuit 730 (i.e., a squaring circuit 730a or 730b) of the syndrome sequencer 920 may generate an even syndrome 965 (i.e., an even syndrome 965a or 965b) by squaring a syndrome 955 (i.e., the syndrome 955a or 955b). In these embodiments, the syndrome sequencer 920 may generate two even syndromes 965a and 965b by squaring corresponding syndromes 955a and 955b. The method 1300 then proceeds to step 1345.

In step 1345, the current syndrome is replaced with the even syndrome in the identified register. In various embodiments, the syndrome sequencer120 replaces the current syndrome with the even syndrome in the register 145 storing the current syndrome (i.e., the identified register). For example, the syndrome sequencer 120 may replace the current syndrome stored in the register 145 identified by the register identifier 160 with the even syndrome 165.

In other embodiments, the syndrome sequencer 920 replaces the current syndrome with the even syndrome in the register 145 storing the current syndrome (i.e., the identified register). For example, the syndrome sequencer 920 may replace the current syndrome stored in the register 145 identified by a register identifier 960 (i.e., a register identifier 960a or 960b) with an even syndrome 965 (i.e., an even syndrome 965a or 965b). In these embodiments, the syndrome sequencer 920 may replace two current syndromes store in two corresponding registers 145 identified by the register identifiers 960a and 960b. The method 1300 then proceeds to step 1350.

In step 1350, it is determined whether an additional syndrome is to be generated for the sequence of syndromes. In various embodiments, the syndrome sequencer 120 determines whether an additional syndrome is to be generated for the sequence of syndromes 170. If the syndrome sequencer 120 determines that an additional syndrome is to be generated for the sequence of syndromes 170, the method 1300 proceeds to step 1355, otherwise the method 1300 proceeds to step 1360.

In other embodiments, the syndrome sequencer 920 determines whether an additional syndrome is to be generated for the sequence of syndromes 970. If the syndrome sequencer 920 determines that an additional syndrome is to be generated for the sequence of syndromes 170, the method 1300 proceeds to step 1355, otherwise the method 1300 proceeds to step 1360.

In step 1355, arrived at from the determination in step 1350 that an additional syndrome is to be generated for the sequence of syndromes, the next syndrome in the sequence of syndromes is selected as the current syndrome. In various embodiments, the syndrome sequencer 120 selects the next syndrome in the sequence of syndromes 170 as the current syndrome. For example, the counter 725 in the syndrome sequencer 120 may select the next syndrome by incrementing the integer 720 to indicate the next syndrome to be generated for the sequence of syndromes 170.

In other embodiments, the syndrome sequencer 920 selects the next syndrome in the sequence of syndromes 970 as the current syndrome. For example, the counter 725 in the syndrome sequencer 920 may select the next syndrome by generating a register identifier 950 (i.e., a register identifier 950a or 950b) which is an integer indicating the next syndrome to be generated for the sequence of syndromes 970. In these embodiments, the syndrome sequencer 920 may select two successive syndromes as the current syndromes. For example, the counter 725 in the syndrome sequencer 920 may select the second syndrome of the two successive syndromes by generating the register identifier 950a which is an integer indicating the second syndrome of the successive syndromes. In this example, the register identifier 950a implicitly identifies the first syndrome of the two successive syndromes which immediately precedes the second syndrome in the sequence of syndromes 170. The method 1300 then returns to step 1320.

In step 1360, arrived at from the determination in step 1345 that an additional syndrome is not to be generated for the sequence of syndromes, the locator polynomial is generated based on the sequence of syndromes. In various embodiments, the sequential polynomial generator 125 generates the locator polynomial 175 based on the sequence of syndromes 170 received from the syndrome sequencer 120. For example, the sequential polynomial generator 125 may generate the locator polynomial 175 by outputting the last polynomial of the sequence of polynomials generated by the sequential polynomial generator 125. The method 1300 then ends.

In other embodiments, the sequential polynomial generator 925 generates the locator polynomial 175 based on the sequence of syndromes 970 received from the syndrome sequencer 920. For example, the sequential polynomial generator 925 may generate the locator polynomial 175 by outputting the last polynomial of the sequence of polynomials generated by the sequential polynomial generator 925. The method 1300 then ends.

In various embodiments, the method 1300 illustrated in FIG. 13 may include more or fewer than the steps 1305-1360 illustrated in FIG. 13 and described above. In some embodiments, the steps 1305-1360 of the method 1300 illustrated in FIG. 13 may be performed in a different order than the order illustrated in FIG. 13 and described above. In some embodiments, some of the steps 1305-1360 of the method 1300 illustrated in FIG. 13 may be performed in parallel or substantially simultaneously. In various embodiments, one or more of the steps 1305-1360 may be performed more than once in the method 1300 illustrated in FIG. 13.

Figure 14:
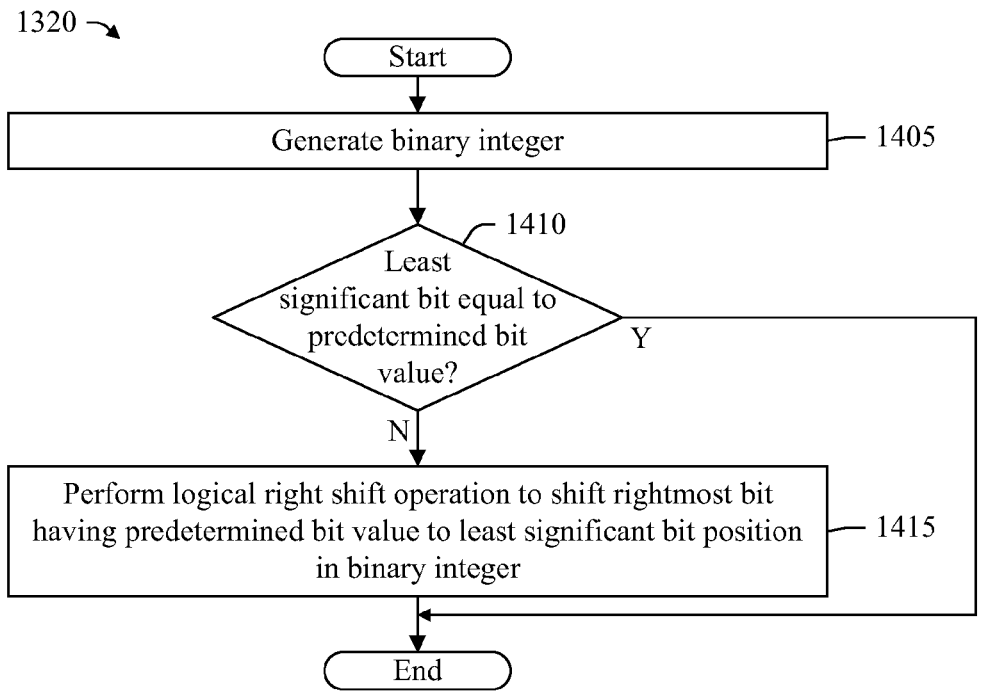
FIG. 14 is a flow chart for a portion of a method of generating a locator polynomial, in accordance with an embodiment of the present invention.

FIG. 14 illustrates a portion of the method 1300 of generating a locator polynomial, in accordance with an embodiment of the present invention. The portion of the method 1300 illustrated in FIG. 14 is an embodiment of the step 1320 of the method 1300 in which a register storing the current syndrome is identified. In step 1405, a binary integer is generated. In various embodiments, the counter 725 of the syndrome sequencer 120 generates a binary integer by generating the integer 720. In other embodiments, the counter 725 of the syndrome sequencer 920 generates a binary integer by generating the integer 720. The portion of the method 1300 then proceeds to step 1410.

In step 1410, it is determined whether the least significant bit of the binary integer is equal to a predetermined value. In various embodiments, the logic circuit 710 of the syndrome sequencer 120 determines whether the least significant bit of the binary integer is equal to a predetermined value. In some embodiments, the logic circuit 710 of the syndrome sequencer 120 is a combinational logic circuit that determines whether the least significant bit of the integer 720 (i.e., the binary integer) generated by the counter 725 in the syndrome sequencer 120 is equal to the predetermined value. In some embodiments, the logic circuit 710 of the syndrome sequencer 120 includes a shift register 715 that determines whether the least significant bit of the integer 720 (i.e., the binary integer) generated by the counter 725 in the syndrome sequencer 120 is equal to the predetermined value. If the syndrome sequencer 120 determines the least significant bit of the binary integer is equal to the predetermined value, the portion of the method 1300 ends. Otherwise, the portion of the method 1300 proceeds to step 1415.

In other embodiments, the logic circuit 710 of the syndrome sequencer 920 determines whether the least significant bit of the binary integer is equal to a predetermined value. In some embodiments, the logic circuit 710 of the syndrome sequencer 920 is a combinational logic circuit that determines whether the least significant bit of the integer 720 (i.e., the binary integer) generated by the counter 725 in the syndrome sequencer 920 is equal to the predetermined value. In some embodiments, the logic circuit 710 of the syndrome sequencer 920 includes a shift register 715 that determines whether the least significant bit of the integer 720 (i.e., the binary integer) generated by the counter 725 in the syndrome sequencer 920 is equal to the predetermined value. If the syndrome sequencer 920 determines the least significant bit of the binary integer is equal to the predetermined value, the portion of the method 1300 ends. Otherwise, the portion of the method 1300 proceeds to step 1415.

In step 1415, arrived at from the determination in step 1410 that the least significant bit of the binary integer is not equal to the predetermined value, a logical right shift operation is performed to shift a rightmost bit having the predetermined bit value to the least significant bit position in the binary integer. In various embodiments, the logic circuit 710 of the syndrome sequencer 120 performs a logical right shift operation to shift a rightmost bit in the binary integer to a least most significant bit position in the binary integer. In some embodiments, the logic circuit 710 of the syndrome sequencer 120 includes a combinational logic circuit which performs the logical right shift operation on the binary integer by performing a logic operation on the integer 720 (i.e., the binary integer). In some embodiments, the logic circuit 710 of the syndrome sequencer 120 includes a shift register 715 which performs the logical right shift operation on the binary integer by performing a logical right shift operation on the integer 720 (i.e., the binary integer). The portion of the method 1300 then ends.

In other embodiments, the logic circuit 710 of the syndrome sequencer 920 performs a logical right shift operation to shift a rightmost bit in the binary integer to a least most significant bit position in the binary integer. In some embodiments, the logic circuit 710 of the syndrome sequencer 920 includes a combinational logic circuit which performs the logical right shift operation on the binary integer by performing a logic operation on the register identifier 950a (i.e., the binary integer). In some embodiments, the logic circuit 710 of the syndrome sequencer 920 includes a shift register 715 which performs the logical right shift operation on the binary integer by performing a logical right shift operation on the register identifier 950a (i.e., the binary integer). The portion of the method 1300 then ends.

In various embodiments, the portion of method 1300 illustrated in FIG. 14 may include more or fewer than the steps 1405-1415 illustrated in FIG. 14 and described above. In some embodiments, the steps 1405-1415 of the portion of the method 1300 illustrated in FIG. 14 may be performed in a different order than the order illustrated in FIG. 14 and described above. In some embodiments, some of the steps 1405-1415 of the portion of the method 1300 illustrated in FIG. 14 may be performed in parallel or substantially simultaneously. In various embodiments, one or more of the steps 1405-1415 may be performed more than once in the portion of the method 1300 illustrated in FIG. 14.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system comprising:
   a syndrome generator configured to generate a series of odd syndromes for a sequence of syndromes including even syndromes and odd syndromes;
   a series of registers coupled to the syndrome generator for storing the series of odd syndromes, the registers of the series of registers having a one-to-one correspondence with the odd syndromes of the series of odd syndromes;
   a syndrome sequencer coupled to the series of registers and configured to generate the sequence of syndromes by selecting each syndrome of the sequence of syndromes in a sequential order of the sequence of syndromes, identifying a register of the series of registers storing the selected syndrome, reading the selected syndrome from the identified register, outputting the selected syndrome for use in generating a locator polynomial, generating an even syndrome of the sequence of syndromes by squaring the selected syndrome, and replacing the selected syndrome stored in the series of registers with the even syndrome by storing the even syndrome into the register storing the selected syndrome; and a locator polynomial generator coupled to the syndrome sequencer and configured to generate the locator polynomial based on the sequence of syndromes generated by the syndrome sequencer.

2. The system of claim 1, wherein the locator polynomial generator is further configured to generate the locator polynomial in a sequence of iterations having a one-to-one correspondence with the syndromes of the sequence of syndromes by generating a polynomial in each iteration of the sequence of iterations based the syndrome corresponding to the iteration, the locator polynomial being the polynomial generated in a last iteration of the sequence of iterations.

3. The system of claim 1, wherein the locator polynomial generator is further configured to generate the locator polynomial in a sequence of iterations, the syndrome sequencer is further configured to read two successive syndromes from the series of registers in an iteration of the sequence of iterations and output the two successive syndromes concurrently in the iteration for use in generating the locator polynomial, and the locator polynomial generator is further configured to generate the locator polynomial by generating a polynomial in an iteration of the sequence of iterations based on the two successive syndromes, the locator polynomial being the polynomial generated in a last iteration of the sequence of iterations.

4. The system of claim 1, wherein the syndrome sequencer is further configured to generate a sequence of register identifiers having a one-to-one correspondence with the sequence of syndromes, each register identifier of the sequence of register identifiers identifying a register of the series of registers for storing the corresponding syndrome of the sequence of syndromes, the number of registers in the series of registers being less than the number of register identifiers in the sequence of register identifiers, and wherein the syndrome sequencer further configured to identify the register storing the selected syndrome based on the sequence of register identifiers.

5. The system of claim 4, wherein the syndrome sequencer is further configured to generate the sequence of register identifiers by generating a sequence of binary integers, identifying each binary integer of the sequence of binary integers not having a predetermined bit value in a least significant bit position of the binary integer, performing a logical right shift operation on each identified binary integer to shift a rightmost bit having the predetermined bit value in the identified binary integer to the least significant bit position of the identified binary integer.

6. The system of claim 5, wherein the syndrome sequencer further comprises:
a counter configured to generate a sequence of integers; and
a logic circuit coupled to the counter and configured to generate the sequence of binary integers based on the sequence of integers generated by the counter by performing a logic operation on each of the integers in the sequence of integers.

7. The system of claim 6, wherein the logic circuit is a combinational logic circuit.

8. The system of claim 6, wherein the logic circuit comprises a shift register configured to generate a binary integer of the sequence of binary integers by performing a logical right shift operation on an integer of the sequence of integers based on the bit position of the rightmost bit having the predetermined value in the integer.

9. The system of claim 1, wherein the syndrome generator is further configured to generate the series of odd syndromes based on an input data unit including both a datum and an error correction code, the system further comprising an analysis module coupled to the locator polynomial generator and configured to identify up to a predetermined number of data bit errors in the input data unit based on the error correction code and the locator polynomial.

10. The system of claim 9, wherein the analysis module is further configure to generate an output data unit by correcting up to a predetermined number of data bit errors identified in the input data unit.

11. A system comprising:
a syndrome generator configured to generate a series of odd syndromes for a sequence of syndromes including even syndromes and odd syndromes;
a series of registers coupled to the syndrome generator for storing the series of odd syndromes, the registers of the series of registers having a one-to-one correspondence with the odd syndromes of the series of odd syndromes;
a syndrome sequencer coupled to the series of registers and configured to generate a sequence of register identifiers having a one-to-one correspondence with the sequence of syndromes, each register identifier of the sequence of register identifiers identifying a register of the series of registers for storing the corresponding syndrome of the sequence of syndromes, the number of registers in the series of registers being less than the number of register identifiers in the sequence of register identifiers, the syndrome sequencer further configured to generate the sequence of syndromes by selecting syndromes of the sequence of syndromes, identifying for each selected syndrome a register of the series of registers storing the selected syndrome based on the sequence of register identifiers, reading the selected syndrome from the identified register, outputting the selected syndrome for use in generating a locator polynomial, generating each even syndrome of the sequence of syndromes by squaring a corresponding syndrome of the selected syndromes, and replacing the corresponding syndrome stored in the series of registers with the even syndrome by storing the even syndrome into the register storing the corresponding syndrome; and
a locator polynomial generator coupled to the syndrome sequencer and configured to generate the locator polynomial based on the sequence of syndromes generated by the syndrome sequencer.

12. The system of claim 11, wherein the locator polynomial generator is further configured to generate the locator polynomial in a sequence of iterations having a one-to-one correspondence with the syndromes of the sequence of syndromes by generating a polynomial in each iteration of the sequence of iterations based the syndrome corresponding to the iteration, the locator polynomial being the polynomial generated in a last iteration of the sequence of iterations.

13. The system of claim 11, wherein the locator polynomial generator is further configured to generate the locator polynomial in a sequence of iterations, the syndrome sequencer is further configured to read two successive syndromes from the series of registers in an iteration of the sequence of iterations and output the two successive syndromes concurrently in the iteration for use in generating the locator polynomial, and the locator polynomial generator is further configured to generate the locator polynomial by generating a polynomial in an iteration of the sequence of iterations based on the two successive syndromes, the locator polynomial being the polynomial generated in a last iteration of the sequence of iterations.

14. The system of claim 11, wherein the syndrome sequencer is further configured to generate the sequence of register identifiers by generating a sequence of binary integers, identifying each binary integer of the sequence of binary integers not having a predetermined bit value in a least significant bit position of the binary integer, performing a logical right shift operation on each identified binary integer to shift a rightmost bit having the predetermined bit value in the identified binary integer to the least significant bit position of the identified binary integer.

15. The system of claim 14, wherein the syndrome sequencer further comprises:
  a counter configured to generate a sequence of integers; and
  a logic circuit coupled to the counter and configured to generate the sequence of binary integers based on the sequence of integers generated by the counter by performing a logic operation on each of the integers in the sequence of integers.

16. The system of claim 15, wherein the logic circuit is a combinational logic circuit.

17. The system of claim 15, wherein the logic circuit comprises a shift register configured to generate a binary integer of the sequence of binary integers by performing a logical right shift operation on an integer of the sequence of integers based on the bit position of the rightmost bit having the predetermined value in the integer.

18. The system of claim 11, wherein the syndrome generator is further configured to generate the series of odd syndromes based on an input data unit including both a datum and an error correction code, the system further comprising an analysis module coupled to the locator polynomial generator and configured to identify up to a predetermined number of data bit errors in the input data unit based on the error correction code and the locator polynomial.

19. The system of claim 18, wherein the analysis module is further configure to generate an output data unit by correcting up to a predetermined number of data bit errors identified in the input data unit.

20. A method comprising:
  generating a series of odd syndromes for a sequence of syndromes including even syndromes and odd syndromes;
  storing the series of odd syndromes into a series of registers, the registers of the series of registers having a one-to-one correspondence with the odd syndromes of the series of odd syndromes;
  generating the sequence of syndromes by selecting syndromes of the sequence of syndromes, identifying for each selected syndrome a register of the series of registers storing the selected syndrome, reading the selected syndrome from the identified register, outputting the selected syndrome for use in generating a locator polynomial, generating each even syndrome of the sequence of syndromes by squaring a corresponding syndrome of the selected syndromes, and replacing the corresponding syndrome stored in the series of registers with the even syndrome by storing the even syndrome into the register storing the corresponding syndrome; and
  generating the locator polynomial based on the sequence of syndromes.

21. The method of claim 20, wherein generating the locator polynomial further comprises generating the locator polynomial in a sequence of iterations having a one-to-one correspondence with the sequence of syndromes by generating a polynomial in each iteration of the sequence of iterations based the syndrome corresponding to the iteration, the locator polynomial being the polynomial generated in a last iteration of the sequence of iterations.

22. The method of claim 21, wherein generating the locator polynomial comprises:
  generating the locator polynomial in a sequence of iterations;
  reading two successive syndromes from the series of registers in an iteration of the sequence of iterations;
  outputting the two successive syndromes concurrently in the iteration for use in generating the locator polynomial; and
  generating a polynomial in an iteration of the sequence of iterations based on two successive syndromes, the locator polynomial being the polynomial generated in a last iteration of the sequence of iterations.

23. The method of claim 20, wherein generating the sequence of syndromes includes generating a sequence of register identifiers having a one-to-one correspondence with the sequence of syndromes, each register identifier of the sequence of register identifiers identifying a register of the series of registers for storing the corresponding syndrome of the sequence of syndromes, the number of registers in the series of registers being less than the number of register identifiers in the sequence of register identifiers, and wherein identifying the register storing the current syndrome comprises identifying the register storing the current syndrome based on the sequence of register identifiers.

24. The method of claim 23, wherein generating the sequence of register identifiers comprises:
  generating a sequence of binary integers;
  identifying each binary integer of the sequence of binary integers not having a predetermined bit value in a least significant bit position of the binary integer; and
  performing a logical right shift operation on each identified binary integer to shift a rightmost bit having the predetermined bit value in the identified binary integer to the least significant bit position of the identified binary integer.

* * * * *